(12) United States Patent
Yuan et al.

(10) Patent No.: US 12,183,278 B2
(45) Date of Patent: Dec. 31, 2024

(54) DISPLAY SUBSTRATE AND DISPLAY APPARATUS

(71) Applicants: Hefei BOE Joint Technology Co., Ltd., Anhui (CN); BOE Technology Group Co., Ltd., Beijing (CN)

(72) Inventors: Zhidong Yuan, Beijing (CN); Yongqian Li, Beijing (CN); Dacheng Zhang, Beijing (CN); Jingbo Xu, Beijing (CN); Can Yuan, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/779,576

(22) PCT Filed: Jul. 21, 2021

(86) PCT No.: PCT/CN2021/107671
§ 371 (c)(1),
(2) Date: May 25, 2022

(87) PCT Pub. No.: WO2023/000215
PCT Pub. Date: Jan. 26, 2023

(65) Prior Publication Data
US 2024/0161691 A1    May 16, 2024

(51) Int. Cl.
*G09G 3/3233*    (2016.01)
(52) U.S. Cl.
CPC ............ *G09G 3/3233* (2013.01); *G09G 2300/0426* (2013.01); *G09G 2300/0852* (2013.01); *G09G 2330/021* (2013.01)
(58) Field of Classification Search
CPC ........ G09G 3/3233; G09G 2300/0426; G09G 2300/0852; G09G 2330/021
See application file for complete search history.

(56) References Cited

U.S. PATENT DOCUMENTS 10,891,896 B2 *  1/2021  Wu .................. G09G 3/3233
2006/0186822 A1   8/2006  Park
(Continued)

FOREIGN PATENT DOCUMENTS

CN     105242439 A     1/2016
CN     107103878 A     8/2017
(Continued)

OTHER PUBLICATIONS

Office Action dated Oct. 18, 2024 for Chinese Patent Application No. 202180001936.4 and English Translation.

*Primary Examiner* — Ibrahim A Khan
(74) *Attorney, Agent, or Firm* — Ling Wu; Stephen Yang; Ling and Yang Intellectual Property

(57) ABSTRACT

A display substrate includes an underlay substrate and a plurality of pixel unit groups. The plurality of pixel unit groups are located in a display region of the underlay substrate. At least one pixel unit group includes a plurality of sub-pixel groups, wherein at least one sub-pixel group includes a pixel circuit. The pixel circuit includes a first sub-pixel circuit, a second sub-pixel circuit, and a light emitting control sub-circuit. The first sub-pixel circuit and the second sub-pixel circuit are both electrically connected to the light emitting control sub-circuit. The light emitting control sub-circuit is configured to control a first light emitting element electrically connected to the first sub-pixel circuit to emit light, and to control a second light emitting element electrically connected to the second sub-pixel circuit to emit light.

19 Claims, 15 Drawing Sheets

(56) References Cited

U.S. PATENT DOCUMENTS

| | | | | |
|---|---|---|---|---|
| 2013/0314308 A1* | 11/2013 | Hsu | ................ | G09G 3/3233 345/82 |
| 2015/0035871 A1* | 2/2015 | Kawae | ................ | G09G 3/3233 345/212 |
| 2015/0187272 A1* | 7/2015 | Kimura | ................ | G09G 3/3233 345/694 |
| 2015/0200241 A1* | 7/2015 | Kim | ................ | G09G 3/3233 257/40 |
| 2016/0055810 A1* | 2/2016 | Asano | ................ | H01L 29/42384 345/212 |
| 2016/0335937 A1 | 11/2016 | Lee et al. | | |
| 2017/0221419 A1* | 8/2017 | Xiang | ................ | G09G 3/3233 |
| 2017/0221423 A1* | 8/2017 | Xiang | ................ | G09G 3/3233 |
| 2017/0278903 A1 | 9/2017 | Zhou et al. | | |
| 2018/0114488 A1* | 4/2018 | Jung | ................ | G09G 3/3258 |
| 2018/0114823 A1* | 4/2018 | Lee | ................ | H10K 59/126 |
| 2018/0137818 A1* | 5/2018 | Kim | ................ | G09G 3/2003 |
| 2018/0226019 A1* | 8/2018 | Tong | ................ | G09G 3/3291 |
| 2019/0035874 A1* | 1/2019 | Han | ................ | H10K 59/131 |
| 2019/0325823 A1 | 10/2019 | Yang et al. | | |
| 2020/0005714 A1* | 1/2020 | Wu | ................ | G09G 3/3233 |
| 2021/0118366 A1 | 4/2021 | Xuan et al. | | |
| 2021/0175296 A1 | 6/2021 | Liu et al. | | |
| 2021/0398492 A1 | 12/2021 | Zhang et al. | | |

FOREIGN PATENT DOCUMENTS

| | | |
|---|---|---|
| CN | 108417178 A | 8/2018 |
| CN | 108877664 A | 11/2018 |
| CN | 109559679 A | 4/2019 |
| CN | 110706653 A | 1/2020 |
| CN | 111028774 A | 4/2020 |
| CN | 111564140 A | 8/2020 |
| CN | 111816123 A | 10/2020 |

* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2021/107671 having an international filing date of Jul. 21, 2021. The above-identified application is hereby incorporated by reference.

TECHNICAL FIELD

The present disclosure relates to, but is not limited to, the field of display technology, in particular to a display substrate and a display apparatus.

BACKGROUND

An Organic Light Emitting Diode (OLED for short) and Quantum-dot Light Emitting Diodes (QLED for short) are active light emitting display devices and have advantages of self-illumination, a wide viewing angle, a high contrast, low power consumption, an extremely high reaction speed, lightness and thinness, bendability, a low cost, etc. With continuous development of display technologies, a display apparatus using the OLED or the QLED as a light emitting device and using a Thin Film Transistor (TFT) for signal control has become a mainstream product in the field of display at present.

SUMMARY

The following is a summary of subject matters described herein in detail. This summary is not intended to limit the scope of protection of claims.

At least one embodiment of the present disclosure provides a display substrate and a display apparatus.

In one aspect, at least one embodiment of the present disclosure provides a display substrate, including an underlay substrate and a plurality of pixel unit groups. The underlay substrate includes a display region. The plurality of pixel unit groups are located in the display region. At least one pixel unit group includes a plurality of sub-pixel groups, wherein at least one sub-pixel group includes a pixel circuit. The pixel circuit includes a first sub-pixel circuit, a second sub-pixel circuit, and a light emitting control sub-circuit, wherein the first sub-pixel circuit and the second sub-pixel circuit are both electrically connected to the light emitting control sub-circuit. The light emitting control sub-circuit is configured to control a first light emitting element electrically connected to the first sub-pixel circuit to emit light, and to control a second light emitting element electrically connected to the second sub-pixel circuit to emit light. The first sub-pixel circuit and the second sub-pixel circuit are substantially symmetrical with respect to a center line of the pixel circuit of the sub-pixel group in a first direction.

In some exemplary embodiments, the light emitting control sub-circuit of the pixel circuit is located between the first sub-pixel circuit and the second sub-pixel circuit in the first direction.

In some exemplary embodiments, the light emitting control sub-circuit is electrically connected to a light emitting control line, wherein the light emitting control line extends along a second direction and is located between the first sub-pixel circuit and the second sub-pixel circuit; the second direction crosses the first direction.

In some exemplary embodiments, the light emitting control sub-circuit includes: a light emitting control transistor; a control electrode of the light emitting control transistor is electrically connected to a light emitting control line, a first electrode of the light emitting control transistor is electrically connected to a first power line, and a second electrode of the light emitting control transistor is electrically connected to the first sub-pixel circuit and the second sub-pixel circuit.

In some exemplary embodiments, the at least one sub-pixel group further includes a first light emitting element electrically connected to the first sub-pixel circuit, and a second light emitting element electrically connected to the second sub-pixel circuit. A first electrode of the first light emitting element is electrically connected to the first sub-pixel circuit, and the first electrode of the second light emitting element is electrically connected to the second sub-pixel circuit. Second electrodes of the first light emitting element and the second light emitting element are both electrically connected to a second power line. The underlay substrate further includes a frame region located on a periphery of the display region. The display region is disposed with a plurality of first auxiliary power lines extending along the first direction, wherein at least one first auxiliary power line is electrically connected to the second electrodes of the first light emitting element and the second light emitting element in the frame region.

In some exemplary embodiments, at least one first auxiliary power line is located between adjacent sub-pixel groups within the at least one pixel unit group in the second direction crossing the first direction.

In some exemplary embodiments, the display region of the underlay substrate is further disposed with a plurality of first power lines extending along the first direction. At least one first power line is located between adjacent pixel unit groups.

In some exemplary embodiments, adjacent pixel unit groups share one first power line.

In some exemplary embodiments, each sub-pixel group of the at least one pixel unit group includes the pixel circuit, the at least one pixel unit group is substantially symmetrical with respect to the center line of a plurality of pixel circuits of the pixel unit group in the second direction, and the second direction crosses the first direction.

In some exemplary embodiments, the display region of the underlay substrate is further disposed with a plurality of sensing lines extending along the first direction. At least one sensing line is located between adjacent sub-pixel groups within the at least one pixel unit group.

In some exemplary embodiments, one sensing line and one first auxiliary power line are disposed between adjacent sub-pixel groups within the at least one pixel unit group; an orthographic projection of the sensing line on the underlay substrate is located on a side of the orthographic projection of the first auxiliary power line on the underlay substrate.

In some exemplary embodiments, one sensing line and two first auxiliary power lines are disposed between adjacent sub-pixel groups within the at least one pixel unit group. The orthographic projections of the two first auxiliary power lines on the underlay substrate are respectively located on both sides of the orthographic projection of the sensing line on the underlay substrate.

In some exemplary embodiments, the auxiliary power line and the sensing line are in a same layer.

In some exemplary embodiments, one first auxiliary power line, one sensing line, and one second auxiliary power line are disposed between adjacent sub-pixel groups within the at least one pixel unit group; the second auxiliary power line extends along the first direction and is electrically connected to the first power line. Overlapping between the orthographic projection of the first auxiliary power line on the underlay substrate and the orthographic projection of the sensing line on the underlay substrate exists, and the orthographic projection of the second auxiliary power line on the underlay substrate is located on a side of the orthographic projection of the sensing line on the underlay substrate.

In some exemplary embodiments, the first auxiliary power line is located on a side of the sensing line close to the underlay substrate in a plane perpendicular to the display substrate.

In some exemplary embodiments, the at least one pixel unit group includes: six sub-pixel groups arranged in sequence along the second direction, wherein the pixel circuits of the first sub-pixel group and the second sub-pixel group are substantially symmetrical with respect to the center line of the pixel circuits of the first sub-pixel group and the second sub-pixel group in the second direction, the second direction crossing the first direction.

In some exemplary embodiments, the display region of the underlay substrate is further disposed with a plurality of data lines extending along the first direction. Two data lines are arranged between the pixel circuits of the first sub-pixel group and the second sub-pixel group, and one data line is arranged between the pixel circuits of the second sub-pixel group and the third sub-pixel group.

In some exemplary embodiments, the first sub-pixel circuit includes a first transistor, a second transistor, a third transistor, and a first storage capacitor. The control electrode of the first transistor is electrically connected to an i-th first scanning line, the first electrode of the first transistor is electrically connected to the data line, and the second electrode of the first transistor is electrically connected to the control electrode of the third transistor. The control electrode of the second transistor is electrically connected to an i-th second scanning line, the first electrode of the second transistor is electrically connected to the sensing line, and the second electrode of the second transistor is electrically connected to the second electrode of the third transistor. The first electrode of the third transistor is electrically connected to the light emitting control sub-circuit. The first electrode of the first storage capacitor is electrically connected to the control electrode of the third transistor, and the second electrode of the first storage capacitor is electrically connected to the second electrode of the third transistor. The second electrode of the third transistor is electrically connected to the first electrode of the first light emitting element. The second sub-pixel circuit includes a fourth transistor, a fifth transistor, a sixth transistor, and a second storage capacitor. The control electrode of the fourth transistor is electrically connected to an (i+1)-th first scanning line, the first electrode of the fourth transistor is electrically connected to the data line, and the second electrode of the fourth transistor is electrically connected to the control electrode of the sixth transistor. The control electrode of the fifth transistor is electrically connected to an (i+1)-th second scanning line, the first electrode of the fifth transistor is electrically connected to the sensing line, and the second electrode of the fifth transistor is electrically connected to the second electrode of the sixth transistor. The first electrode of the sixth transistor is electrically connected to the light emitting control sub-circuit. The first electrode of the second storage capacitor is electrically connected to the control electrode of the sixth transistor, and the second electrode of the second storage capacitor is electrically connected to the second electrode of the sixth transistor. The second electrode of the sixth transistor is electrically connected to the first electrode of the second light emitting element. Herein, i is a natural number.

In some exemplary embodiments, in a plane perpendicular to the display substrate, the display substrate includes a first conductive layer, a semiconductor layer, a second conductive layer, and a third conductive layer which are disposed on the underlay substrate. The first conductive layer at least includes the second electrode of the first storage capacitor of the pixel circuit and the second electrode of the second storage capacitor. The semiconductor layer at least includes active layers of a plurality of transistors of the pixel circuit, the first electrode of the first storage capacitor, and the second electrode of the second storage capacitor. The second conductive layer at least includes the control electrodes of a plurality of transistors of the pixel circuit, the first scanning line, the second scanning line, and the light emitting control line. The third conductive layer at least includes the data line and the sensing line.

In some exemplary embodiments, the first auxiliary power line electrically connected to the second electrodes of the first light emitting element and the second light emitting element is located at the first conductive layer or the third conductive layer.

According to another aspect, an embodiment of the present disclosure further provides a display device, which includes the abovementioned display substrates.

After the accompanying drawings and detailed descriptions are read and understood, other aspects may be understood.

BRIEF DESCRIPTION OF DRAWINGS

Accompanying drawings are used for providing further understanding for technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of one or more components in the accompanying drawings do not reflect actual scales and are only intended to illustrate the contents of the present disclosure.

DETAILED DESCRIPTION

Figure 1:
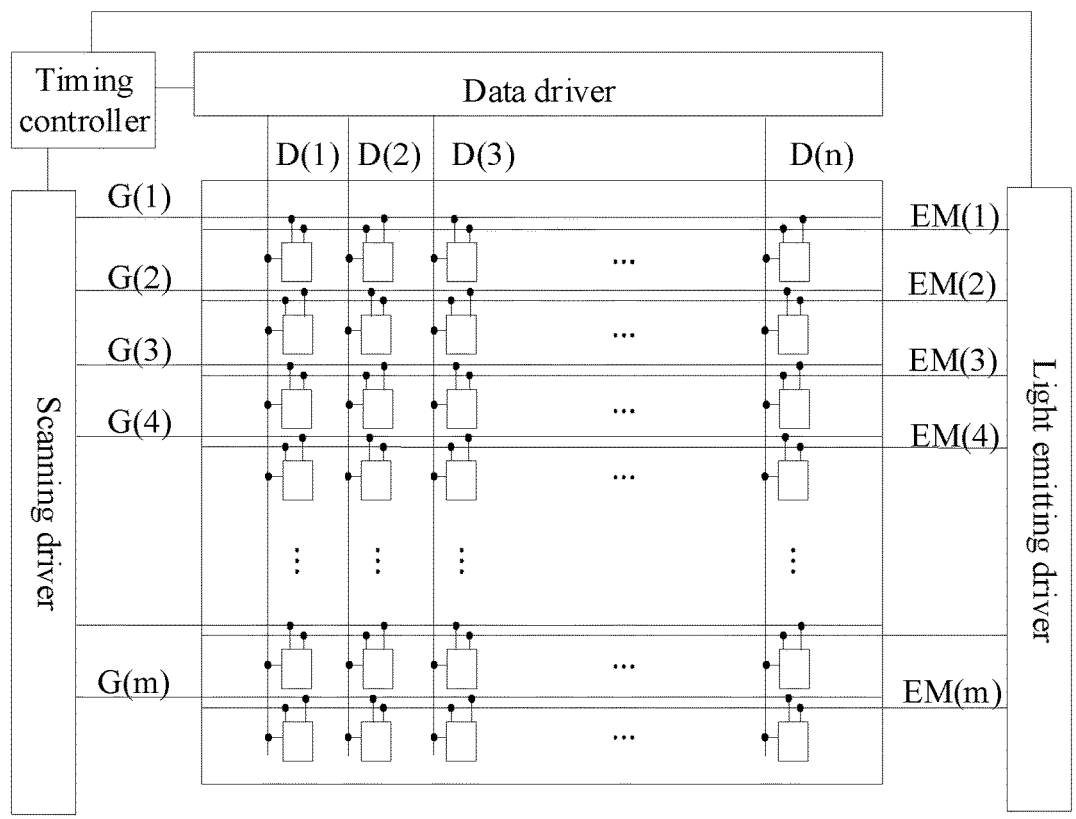
FIG. 1 is a schematic diagram of a structure of a display substrate according to at least one embodiment of the present disclosure.

Embodiments of the present disclosure will be described in detail below with reference to the accompanying drawings. Their implementations may be carried out in many different forms. Those of ordinary skill in the art may easily understand such a fact that manners and contents may be transformed into other forms without departing from the purpose and scope of the present disclosure. Therefore, the present disclosure should not be interpreted as being limited to the contents recorded in the following implementations only. The embodiments in the present disclosure and features in the embodiments can be arbitrarily combined with each other if there are no conflicts.

In the accompanying drawings, a size of one or more constituent elements, a thickness of a layer or an area is sometimes exaggerated for clarity. Therefore, one implementation of the present disclosure is not necessarily limited to the dimension, and shapes and sizes of one or a plurality of components in the accompanying drawings do not reflect actual scales. In addition, the drawings schematically illustrate ideal examples, and an implementation of the present disclosure is not limited to the shapes, numerical values, or the like shown in the drawings.

Ordinal numerals such as "first", "second", and "third" in the specification are set to avoid confusion of constituent elements, but are not intended to limit in terms of quantity. "A plurality of" in the present disclosure means a quantity of two or more.

In the specification, for convenience, wordings indicating orientation or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to the direction where the constituent elements are described. Therefore, the positional relationships are not limited to the words and phrases used in the specification, and appropriate substitutions may be made according to situations.

In the specification, unless otherwise specified and defined explicitly, terms "mount", "mutually connect", and "connect" should be understood in a broad sense. For example, it may be a fixed connection, a detachable connection, or an integrated connection, it may be a mechanical connection or a connection, and it may be a direct connection, an indirect connection through intermediate components, or communication inside two components. For those of ordinary skills in the art, meanings of the abovementioned terms in the present disclosure may be understood according to situations.

In this specification, a transistor refers to an element which at least includes three terminals, i.e., a gate electrode (gate electrode), a drain electrode, and a source electrode. The transistor has a channel region between the drain electrode (drain electrode terminal, drain region, or drain electrode) and the source electrode (source electrode terminal, source region, or source electrode), and a current can flow through the drain electrode, the channel region, and the source electrode. In this specification, the channel region refers to a region which the current mainly flows through.

In this specification, a first electrode may be a drain electrode and a second electrode may be a source electrode, or, a first electrode may be a source electrode and a second electrode may be a drain electrode. In addition, the gate electrode may alternatively be called a control electrode. In a case that transistors with opposite polarities are used, or in a case that a direction of a current changes during work of a circuit, or the like, functions of the "source electrode" and the "drain electrode" may sometimes be exchanged. Therefore, the "source electrode" and the "drain electrode" may be exchanged in this specification.

In the specification, "electrical connection" includes a case that constituent elements are connected together through an element with a certain electrical effect. There is no specific restriction on "the element with certain electrical effect" as long as it may transmit electrical signals between the connected constituent elements. Examples of "the element with the certain electric action" not only include an electrode and a wiring, but further include a switch element such as a transistor, a resistor, an inductor, a capacitor, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is 80° or more and 100° or less, and thus also includes a state in which the angle is 85° or more and 95° or less.

"About", or "more or less" in the present disclosure refers to a situation that a boundary is defined not strictly and numerical values within process and measurement error ranges are allowed.

An embodiment of the present disclosure provides a display substrate, including an underlay substrate and a plurality of pixel unit groups. The underlay substrate includes a display region, and the plurality of pixel unit groups are located in the display region. At least one pixel unit group includes a plurality of sub-pixel groups, wherein at least one sub-pixel group includes a pixel circuit. The pixel circuit of the at least one sub-pixel group includes a first sub-pixel circuit, a second sub-pixel circuit, and a light emitting control sub-circuit. The first sub-pixel circuit and the second sub-pixel circuit are both electrically connected to the light emitting control sub-circuit. The light emitting control sub-circuit is configured to control a first light emitting element electrically connected to the first sub-pixel circuit, and to control a second light emitting element electrically connected to the second sub-pixel circuit to emit light. The first sub-pixel circuit and the second sub-pixel circuit are substantially symmetrical with respect to a center line of the pixel circuit of the sub-pixel group in a first direction.

The display substrate provided by the present embodiment may achieve high gray level grade and improve display effect by disposing the light emitting control sub-circuit in the pixel circuit; furthermore, by setting the first sub-pixel circuit and the second sub-pixel circuit substantially symmetrical with respect to a center line of the sub-pixel group in the first direction, space may be optimized, and resolution may be increased without affecting normal display.

In some exemplary embodiments, the light emitting control sub-circuit of the pixel circuit is located between the first sub-pixel circuit and the second sub-pixel circuit in the first direction. In the present example, the first sub-pixel circuit, the light emitting control sub-circuit, and the second sub-pixel circuit of the pixel circuit may be arranged in sequence along the first direction. In some examples, the first direction crosses a second direction, for example, they are perpendicular to each other. For example, the first direction is parallel to a sub-pixel column direction and the second direction is parallel to a sub-pixel row direction. However, the present embodiment is not limited thereto.

In some exemplary embodiments, the light emitting control sub-circuit is electrically connected to a light emitting control line. The light emitting control line extends along the second direction crossing the first direction and is located between the first sub-pixel circuit and the second sub-pixel circuit.

In some exemplary embodiments, the light emitting control sub-circuit includes a light emitting control transistor. A control electrode of the light emitting control transistor is electrically connected to a light emitting control line, a first electrode of the light emitting control transistor is electrically connected to a first power line, and a second electrode of the light emitting control transistor is electrically connected to the first sub-pixel circuit and the second sub-pixel circuit. However, the present embodiment is not limited thereto.

In some exemplary embodiments, the at least one sub-pixel group further includes a first light emitting element electrically connected to the first sub-pixel circuit, and a second light emitting element electrically connected to the second sub-pixel circuit. The first electrode of the first light emitting element is electrically connected to the first sub-pixel circuit, and the first electrode of the second light emitting element is electrically connected to the second sub-pixel circuit. Second electrodes of the first light emitting element and the second light emitting element are both electrically connected to a second power line. The underlay substrate further includes a frame region located on a periphery of the display region. The display region is disposed with a plurality of first auxiliary power lines extending along the first direction, wherein at least one first auxiliary power line is electrically connected to the second electrodes of the first light emitting element and the second light emitting element in the frame region. The present exemplary embodiment may reduce IR drop of the second power line by disposing the first auxiliary power line on the display substrate.

In some exemplary embodiments, the at least one first auxiliary power line is located between adjacent sub-pixel groups within the at least one pixel unit group in the second direction crossing the first direction. For example, the at least one pixel unit group includes six sub-pixel groups arranged along the second direction, and the at least one first auxiliary power line may be located between the third sub-pixel group and the fourth sub-pixel group. However, the present embodiment is not limited thereto.

In some exemplary embodiments, the display region of the underlay substrate is further disposed with a plurality of first power lines extending along the first direction. At least one first power line is located between adjacent pixel unit groups. However, the present embodiment is not limited thereto.

In some exemplary embodiments, adjacent pixel unit groups share one first power line. In the present example, one first power line may be disposed between adjacent pixel unit groups, and all the adjacent pixel unit groups are electrically connected to the first power line. However, the present embodiment is not limited thereto. For example, two first power lines may be arranged between adjacent pixel unit groups, and one first power line is electrically connected to one pixel unit group.

In some exemplary embodiments, each sub-pixel group of the at least one pixel unit group includes the pixel circuit, the at least one pixel unit group is substantially symmetrical with respect to the center line of a plurality of pixel circuits of the pixel unit group in the second direction. Herein, the second direction crosses the first direction. However, the present embodiment is not limited thereto.

In some exemplary embodiments, the display region of the underlay substrate is further disposed with a plurality of sensing lines extending along the first direction. At least one sensing line is located between adjacent sub-pixel groups within the at least one pixel unit group. In some examples, the pixel unit group includes six sub-pixel groups arranged along the second direction, one sensing line may be located between the third sub-pixel group and the fourth sub-pixel group, and the pixel circuits of the six sub-pixel groups are all electrically connected to the sensing line. However, the present embodiment is not limited thereto. For example, two sensing lines may be disposed between the third sub-pixel group and the fourth sub-pixel group included in the pixel unit group, and the pixel circuits of the first sub-pixel group to third sub-pixel group may be electrically connected to one of the sensing lines, and the pixel circuits of the fourth sub-pixel group to sixth sub-pixel group may be electrically connected to the other sensing line.

In some exemplary embodiments, one sensing line and one first auxiliary power line are disposed between adjacent sub-pixel groups within the at least one pixel unit group. An orthographic projection of the sensing line on the underlay substrate is located on a side of the orthographic projection of the first auxiliary power line on the underlay substrate. In the present example, the orthographic projection of the sensing line on the underlay substrate and the orthographic projection of the first auxiliary power line on the underlay substrate may not overlap. In some examples, the first auxiliary power line and the sensing line may be in a same layer. However, the present embodiment is not limited thereto.

In some exemplary embodiments, one sensing line and two first auxiliary power lines are disposed between adjacent sub-pixel groups within the at least one pixel unit group. The orthographic projections of the two first auxiliary power lines on the underlay substrate are respectively located on both sides of the orthographic projection of the sensing line on the underlay substrate. In the present example, the orthographic projection of the sensing line on the underlay substrate and the orthographic projections of the two first auxiliary power line on the underlay substrate may not overlap. In some examples, the first auxiliary power line and the sensing line may be in the same layer. However, the present embodiment is not limited thereto.

In some exemplary embodiments, one first auxiliary power line, one sensing line, and one second auxiliary power line may be disposed between adjacent sub-pixel groups within the at least one pixel unit group. The second auxiliary power line extends along the first direction and is electrically connected to the first power line. There is an overlapping between the orthographic projection of the first auxiliary power line on the underlay substrate and the orthographic projection of the sensing line on the underlay substrate, and the orthographic projection of the second auxiliary power line on the underlay substrate is located on a side of the orthographic projection of the sensing line on the underlay substrate. In some examples, the orthographic projection of the second auxiliary power line on the underlay substrate and the orthographic projections of the sensing line and the first auxiliary power line on the underlay substrate may not overlap. In some examples, the second auxiliary power line and the sensing line may be in the same layer. However, the present embodiment is not limited thereto.

In some exemplary embodiments, the first auxiliary power line may be located on a side of the sensing line close to the underlay substrate in a plane perpendicular to the display substrate.

In some exemplary embodiments, the at least one pixel unit group includes: six sub-pixel groups arranged in sequence along the second direction, wherein the pixel circuits of the first sub-pixel group and the second sub-pixel group are substantially symmetrical with respect to the center line of the pixel circuits of the first sub-pixel group and the second sub-pixel group in the second direction, the second direction crossing the first direction. However, the present embodiment is not limited thereto.

In some exemplary embodiments, the display region of the underlay substrate is further disposed with a plurality of data lines extending along the first direction. Two data lines may be arranged between the pixel circuits of the first sub-pixel group and the second sub-pixel group, and one data line may be arranged between the pixel circuits of the second sub-pixel group and the third sub-pixel group. However, the present embodiment is not limited thereto.

In some exemplary embodiments, the first sub-pixel circuit may include a first transistor, a second transistor, a third transistor, and a first storage capacitor. The control electrode of the first transistor is electrically connected to an i-th first scanning line, the first electrode of the first transistor is electrically connected to the data line, and the second electrode of the first transistor is electrically connected to the control electrode of the third transistor. The control electrode of the second transistor is electrically connected to an i-th second scanning line, the first electrode of the second transistor is electrically connected to the sensing line, and the second electrode of the second transistor is electrically connected to the second electrode of the third transistor. The first electrode of the third transistor is electrically connected to the light emitting control sub-circuit. The first electrode of the first storage capacitor is electrically connected to the control electrode of the third transistor, and the second electrode of the first storage capacitor is electrically connected to the second electrode of the third transistor. The second electrode of the third transistor is electrically connected to the first electrode of the first light emitting element. The second sub-pixel circuit includes a fourth transistor, a fifth transistor, a sixth transistor, and a second storage capacitor. The control electrode of the fourth transistor is electrically connected to an (i+1)-th first scanning line, the first electrode of the fourth transistor is electrically connected to the data line, and the second electrode of the fourth transistor is electrically connected to the control electrode of the sixth transistor. The control electrode of the fifth transistor is electrically connected to an (i+1)-th second scanning line, the first electrode of the fifth transistor is electrically connected to the sensing line, and the second electrode of the fifth transistor is electrically connected to the second electrode of the sixth transistor. The first electrode of the sixth transistor is electrically connected to the light emitting control sub-circuit. The first electrode of the second storage capacitor is electrically connected to the control electrode of the sixth transistor, and the second electrode of the second storage capacitor is electrically connected to the second electrode of the sixth transistor. The second electrode of the sixth transistor is electrically connected to the first electrode of the second light emitting element. Herein, i is a natural number.

In some exemplary embodiments, in a plane perpendicular to the display substrate, the display substrate includes a first conductive layer, a semiconductor layer, a second conductive layer, and a third conductive layer which are disposed on the underlay substrate. The first conductive layer at least includes the second electrode of the first storage capacitor of the pixel circuit and the second electrode of the second storage capacitor. The semiconductor layer at least includes an active layer of a plurality of transistors of the pixel circuit, the first electrode of the first storage capacitor, and the second electrode of the second storage capacitor. The second conductive layer at least includes the control electrodes of a plurality of transistors of the pixel circuit, the first scanning line, the second scanning line, and the light emitting control line. The third conductive layer at least includes the data line and the sensing line.

In some exemplary embodiments, the first auxiliary power line electrically connected to the second electrodes of the first light emitting element and the second light emitting element may be located in the first conductive layer or the third conductive layer. However, the present embodiment is not limited thereto.

The display substrate of the present embodiment will now be described with some examples.

FIG. 1 is a schematic diagram of a structure of a display substrate according to at least one embodiment of the present disclosure. As shown in FIG. 1, the display substrate may include a timing controller, a data driver, a scanning driver, a light emitting driver, and a pixel array. The pixel array may include a plurality of scanning lines (for example, G(1) to G(m)), a plurality of data lines (for example, D(1) to D(n)), a plurality of light emitting control lines (for example, EM(1) to EM(m)), and a plurality of sub-pixel groups. Herein, m and n are both natural numbers.

In some exemplary embodiments, the timing controller may provide a gray-scale value and control signal suitable for a specification of the data driver for the data driver, provide a clock signal, scanning starting signal, etc., suitable for a specification of the scanning driver for the scanning driver, and provide a clock signal, transmission stopping signal, etc., suitable for a specification of the light emitting driver for the light emitting driver. The data driver may generate a data voltage to be provided to the data lines D(1) to D(n) by using a gray-scale value and a control signal received from the timing controller, wherein n may be a natural number. For example, the data driver may sample the gray-scale value by using a clock signal, and apply the data voltage corresponding to the gray-scale value to the data lines D(1) to D(n) taking pixel row as the unit. The scanning driver may generate a scanning signal to be provided to the scanning lines G(1) to G(m) by receiving the clock signal, a scanning starting signal, etc., from the timing controller, wherein m may be a natural number. For example, the scanning driver may sequentially provide the scanning signals with on-level pulses to the scanning lines G(1) to G(m). For example, the scanning driver may be constructed in a form of a shift register and may generate the scanning signal by sequentially transmitting the scanning starting signal provided in a form of the on-level pulse to a next-stage circuit under the control of the clock signal. The light emitting driver may generate a transmitting signal to be provided to the light emitting control lines EM(1) to EM(m) by receiving the clock signal, the transmission stopping signal, etc., from the timing controller. For example, the light emitting driver may provide sequentially the transmitting signal with an off-level pulse to the light emitting control lines EM(1) to EM(m). For example, the light emitting driver may be constructed in a form of the shift register and generate a light emitting signal by sequentially transmitting emission stop signals provided in the form of the off-level pulse to the next-stage circuit under the control of the clock signal. The pixel array may include a plurality of pixel unit groups, wherein at least one pixel unit group may include a plurality of sub-pixel groups.

Figure 2:
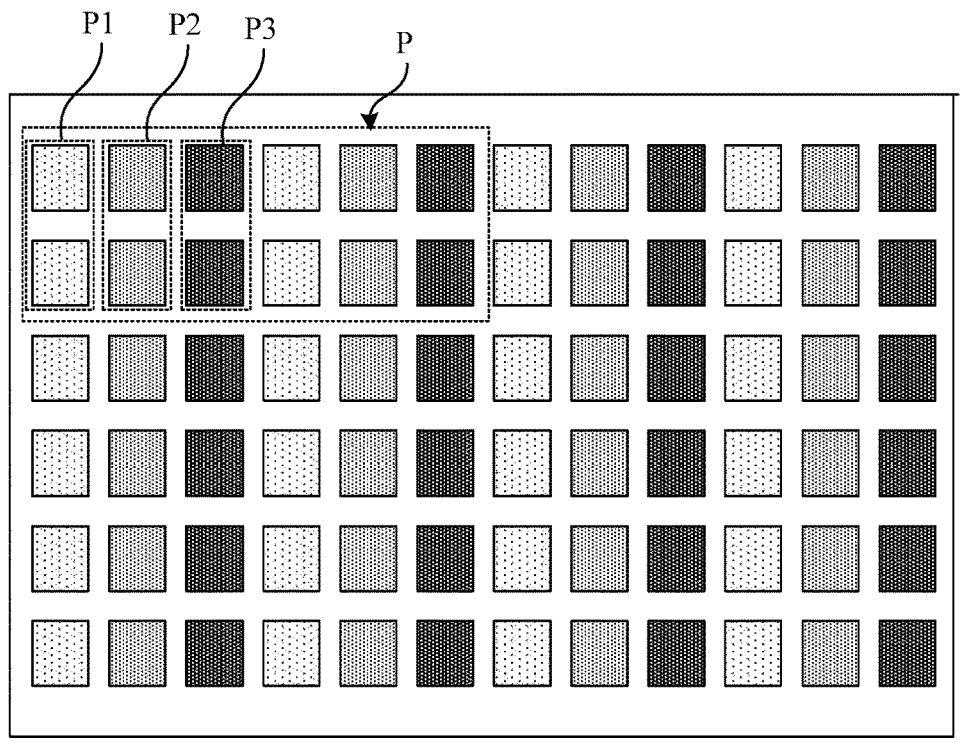
FIG. 2 is a schematic plan view of a display substrate according to at least one embodiment of the present disclosure.

FIG. 2 is a schematic plan view of a display substrate according to at least one embodiment of the present disclosure. In some exemplary embodiments as shown in FIG. 2 the display substrate may include a plurality of pixel unit groups P arranged in a matrix manner, wherein at least one of the plurality of pixel unit groups P may include a plurality of sub-pixel groups. At least one pixel unit group P includes six sub-pixel groups (e.g. two first sub-pixel groups P1, two second sub-pixel groups P2, and two third sub-pixel groups P3) arranged in sequence along the second direction. At least one sub-pixel group includes the pixel circuit, the first light emitting element, and the second light emitting element. For example, the pixel circuit of the at least one sub-pixel group includes a first sub-pixel circuit, a light emitting control sub-circuit, and a second sub-pixel circuit arranged in sequence along the first direction; the first light emitting element is electrically connected to the first sub-pixel circuit, and the second light emitting element is electrically connected to the second sub-pixel circuit. Herein, the first direction crosses the second direction, for example, the first direction is perpendicular to the second direction. In some examples, the first sub-pixel group P1 may emit light of a first color, the second sub-pixel group P2 may emit light of a second color, and the third sub-pixel group P3 may emit light of a third color. For example, the light of the first-color may be red light, the light of the second-color may be green light, and the light of the third-color may be blue light. However, the present embodiment is not limited thereto. For example, two light emitting elements in the same sub-pixel group may emit light of same or different colors.

In some exemplary embodiments, the first sub-pixel circuit and the light emitting control sub-circuit are configured to receive the data voltage transmitted by the data line and output a corresponding current to the first light emitting element under the control of the scanning line and the light emitting control line. The second sub-pixel circuit and the light emitting control sub-circuit are configured to receive the data voltage transmitted by the data line and output a corresponding current to the second light emitting element under the control of the scanning line and the light emitting control line. The light emitting control sub-circuit is configured to control the first light emitting element electrically connected to the first sub-pixel circuit to emit light, and to control the second light emitting element electrically connected to the second sub-pixel circuit to emit light. The first light emitting element is configured to emit light of a corresponding brightness in response to the current outputted by the first sub-pixel circuit, and the second light emitting element is configured to emit light of a corresponding brightness in response to the current outputted by the second sub-pixel circuit. In the present example, the at least one sub-pixel group may include two sub-pixels sharing the light emitting control sub-circuit, for example, one sub-pixel thereof may include the first sub-pixel circuit and the first light emitting element, and the other sub-pixel may include the second sub-pixel circuit and the second light emitting element. However, the present embodiment is not limited thereto.

In some exemplary embodiments, one pixel unit in the at least one pixel unit group P may include a Red (R) sub-pixel, a Green (G) sub-pixel, and a Blue (B) sub-pixel, or may include the red sub-pixel, the green sub-pixel, the blue sub-pixel, and a white sub-pixel, which is not limited by the present disclosure herein. In some exemplary implementations, the shape of the sub-pixel in the pixel unit may be a rectangle, a rhombus, a pentagon, or a hexagon. When the pixel unit includes three sub-pixels, the three sub-pixels may be arranged in parallel in a horizontal direction, in parallel in a vertical direction, or in a Delta shape. When the pixel unit includes four sub-pixels, the four sub-pixels may be arranged in parallel in the horizontal direction, in parallel in the vertical direction, or in a square, which is not limited by the present disclosure herein.

Figure 3:
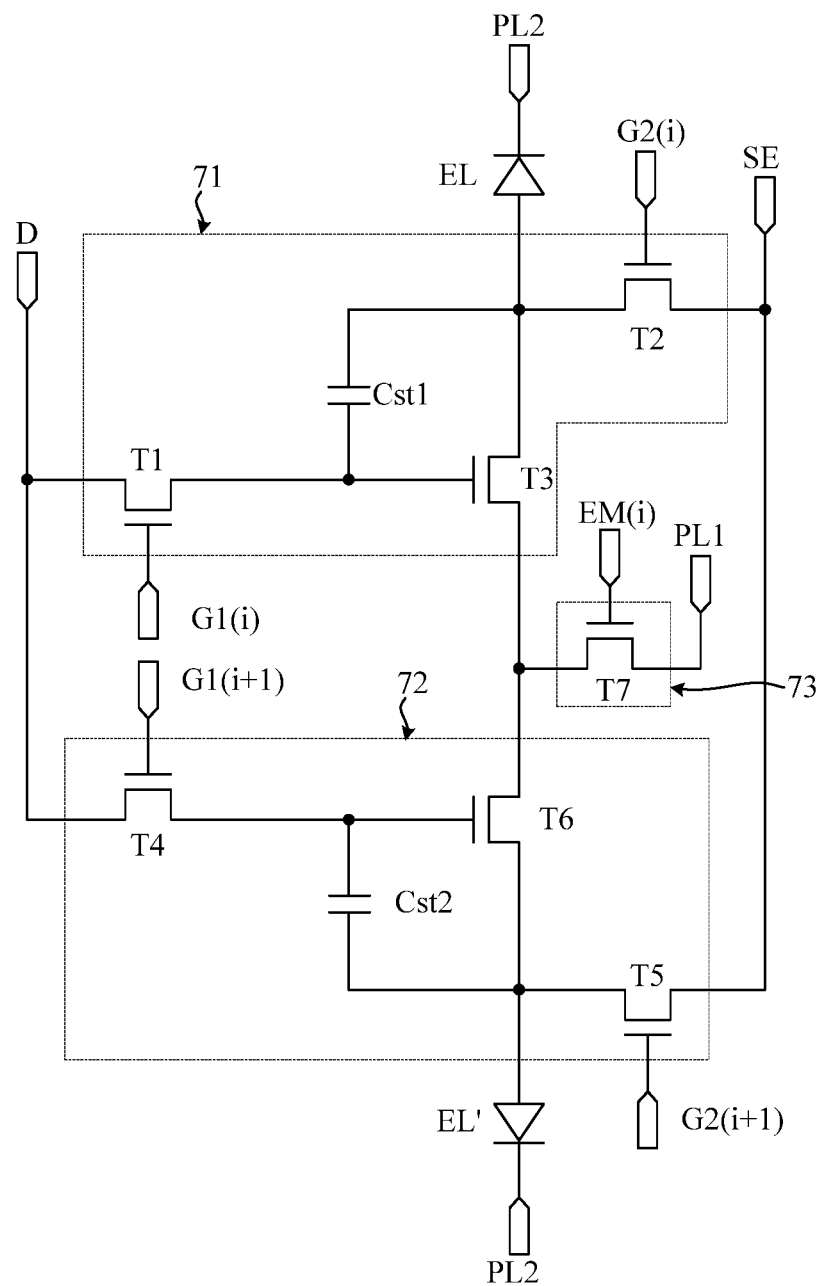
FIG. 3 is an equivalent circuit diagram of a pixel circuit of a sub-pixel group according to at least one embodiment of the present disclosure.

FIG. 3 is an equivalent circuit diagram of a pixel circuit of a sub-pixel group according to at least one embodiment of the present disclosure. In some exemplary embodiments, as shown in FIG. 3, the pixel circuit of the sub-pixel group includes a first sub-pixel circuit 71, a second sub-pixel circuit 72, and a light emitting control sub-circuit 73. The first sub-pixel circuit 71 and the second sub-pixel circuit 72 are both electrically connected to the light emitting control sub-circuit 73. In FIG. 3, it is illustrated taking that the first sub-pixel circuit of the sub-pixel group is electrically connected to an i-th row scanning line and the second sub-pixel circuit is electrically connected to an (i+1)-th row scanning line as an example, herein i is a natural number.

In some exemplary embodiments, as shown in FIG. 3, the first sub-pixel circuit 71 of the sub-pixel group includes: the first transistor T1, the second transistor T2, the third transistor T3, and the first storage capacitor Cst1. In some examples, the first transistor T1 may be referred to as a switching transistor, the second transistor T2 may be referred to as a sensing compensation transistor, and the third transistor T3 may be referred to as a driving transistor.

In some exemplary embodiments, as shown in FIG. 3, the control electrode of the first transistor T1 is electrically connected to the first scanning line G1(i), the first electrode of the first transistor T1 is electrically connected to the data line D, and the second electrode of the first transistor T1 is electrically connected to the control electrode of the third transistor T3. The control electrode of the second transistor T2 is electrically connected to the second scanning line G2(i), the first electrode of the second transistor T2 is electrically connected to the sensing line SE, and the second electrode of the second transistor T2 is electrically connected to the second electrode of the third transistor T3. The first electrode of the third transistor T3 is electrically connected to the light emitting control sub-circuit 73. The first electrode of the first storage capacitor Cst1 is electrically connected to the control electrode of the third transistor T3, and the second electrode of the first storage capacitor Cst1 is electrically connected to the second electrode of the third transistor T3. The first storage capacitor Cst1 is configured to store an electric potential of the control electrode of the third transistor T3. The first electrode of the first light emitting element EL is electrically connected to the second electrode of the third transistor T3, and the second electrode of the first light emitting element EL is electrically connected to the second power line PL2.

In some exemplary embodiments, the first transistor T1 is configured to receive the data signal transmitted by the data line D under the control of the first scanning line G1(i) and cause the control electrode of the third transistor T3 to receive the data signal. The third transistor T3 is configured to generate a corresponding current at the second electrode by using a first power signal provided by the light emitting control sub-circuit 73 under the control of the data signal received at its control electrode. The first light emitting element EL is configured to emit light of a corresponding brightness in response to the current generated by the second electrode of the third transistor T3. The second transistor T2 is configured to extract a threshold voltage Vth and a mobility ratio of the third transistor T3 in response to compensation timing to compensate the threshold voltage Vth.

In some exemplary embodiments, as shown in FIG. 3, the second sub-pixel circuit 72 of the sub-pixel group includes the fourth transistor T4, the fifth transistor T5, the sixth transistor T6, and the second storage capacitor Cst2. In some examples, the fourth transistor T4 may be referred to as the switching transistor, the fifth transistor T5 may be referred to as the sensing compensation transistor, and the sixth transistor T6 may be referred to as the driving transistor.

In some exemplary embodiments, as shown in FIG. 3, the control electrode of the fourth transistor T4 is electrically connected to the first scanning line G1(i+1), the first electrode of the fourth transistor T4 is electrically connected to the data line D, and the second electrode of the fourth transistor T4 is electrically connected to the control electrode of the sixth transistor T6. The control electrode of the fifth transistor T5 is electrically connected to the second scanning line G2(i+1), the first electrode of the fifth transistor T5 is electrically connected to the sensing line SE, and the second electrode of the fifth transistor T5 is electrically connected to the second electrode of the sixth transistor T6. The first electrode of the sixth transistor T6 is electrically connected to the light emitting control sub-circuit 73. The first electrode of the second storage capacitor Cst2 is electrically connected to the control electrode of the sixth transistor T6, and the second electrode of the second storage capacitor Cst2 is electrically connected to the second electrode of the sixth transistor T6. The first electrode of the second light emitting element EL' is electrically connected to the second electrode of the sixth transistor T6, and the second electrode of the second light emitting element EL' is electrically connected to the second power line PL2.

In some exemplary embodiments, as shown in FIG. 3, the light emitting control sub-circuit in the sub-pixel group may include the light emitting control transistor T7. The control electrode of the light emitting control transistor T7 is electrically connected to the light emitting control line EM(i), the first electrode of the light emitting control transistor T7 is electrically connected to the first power line PL1, and the second electrode of the light emitting control transistor T7 is electrically connected to the first electrode of the third transistor T3 and the first electrode of the sixth transistor T6. The light emitting control transistor T7 is configured to transmit a first power signal provided by the first power line PL1 to the first electrode of the third transistor T3 and the first electrode of the sixth transistor T6 under the control of the light emitting control line EM(i).

In the present exemplary embodiment, the first sub-pixel circuit and the second sub-pixel circuit within the sub-pixel group are both electrically connected to the same light emitting control sub-circuit. That is, adjacent sub-pixels within the sub-pixel group share one light emitting control sub-circuit. The pixel circuit of the present exemplary embodiment may realize high gray level grade display by disposing the light emitting control sub-circuit, thereby improving the display effect.

In some exemplary embodiments, the first power line PL1 may keep providing high-level signals, and the second power line PL2 may keep providing low-level signals. The first transistor T1 to the sixth transistor T6 and the light emitting control transistor T7 may be P-type transistors or N-type transistors. Use of the same type of transistors in a pixel driving circuit may simplify a process flow, reduce process difficulties of the display panel, and improve a yield of a product.

In an exemplary embodiments, the first transistor T1 to the sixth transistor T6 and the light emitting control transistor T7 may be made of low temperature poly-silicon thin film transistors, or may be made of oxide thin film transistors, or may be made of both the low temperature poly-silicon thin film transistors and the oxide thin film transistors. The active layer of the low temperature poly-silicon thin film transistor is made of Low Temperature Poly-Silicon (LTPS), and the active layer of the oxide thin film transistor is made of an oxide semiconductor (Oxide). The low temperature poly-silicon thin film transistor has the advantages of high mobility, fast charging, and the like, and the oxide thin film transistor has the advantages of low leakage current and the like. In some exemplary embodiments, the low temperature poly-silicon thin film transistors and the oxide thin film transistors may be integrated on one display substrate to form a Low Temperature Polycrystalline Oxide (LTPO) display substrate. Advantages of the low temperature poly-silicon thin film transistor and the oxide thin film transistor may be used to achieve high Pixel Per Inch (PPI) and low frequency driving, so that power consumption may be reduced, and display quality may be improved.

In some exemplary embodiments, the first light emitting element EL and the second light emitting element EL' may be an organic electroluminescent diode (such as OLED). The first light emitting element EL and the second light emitting element EL' may each include the first electrode (anode), an organic light emitting layer, and the second electrode (cathode) which are stacked.

Figure 4:
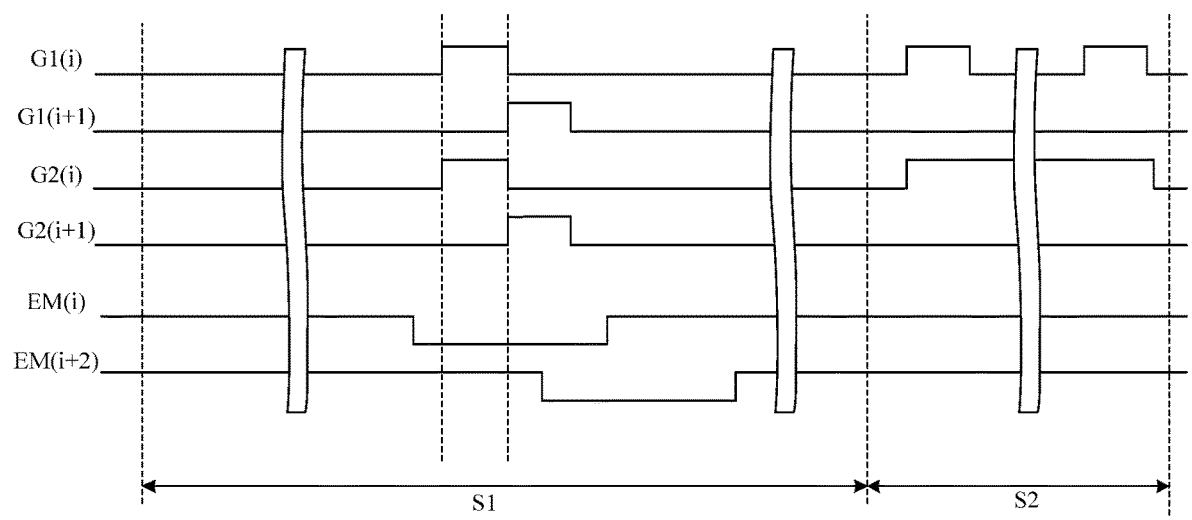
FIG. 4 is a working sequence diagram of a pixel circuit according to at least one embodiment of the present disclosure.

FIG. 4 is a working sequence diagram of a pixel circuit according to at least one embodiment of the present disclosure. A working process of the pixel circuit of the present embodiment will be described below by taking as an example that the plurality of transistors of the pixel circuit are all the N-type transistors.

In some exemplary embodiments, the operation process of the pixel circuit of the present embodiment includes a display stage S1 and an idle stage S2. In the idle stage between every two frames of the display stages, a compensation operation for a row of sub-pixels may be completed, for example, the detection for the threshold voltage Vth and the mobility of the driving transistor of a row of sub-pixels may be completed, so that the detected data is used to obtain a compensation data signal to complete the display in the display stage.

In some exemplary embodiments, as shown in FIGS. 3 and 4, the display stage may include a data writing stage and a light emitting stage taking the working process of the first sub-pixel circuit of the sub-pixel group as an example.

At the data writing stage, the first scanning line G1(i) and the second scanning line G2(i) provide the high-level signal, and the first transistor T1 and the second transistor T2 of the first sub-pixel circuit are turned on. The first transistor T1 is turned on, the data signal provided by the data line D is written to the control electrode of the third transistor T3, and the first storage capacitor Cst1 is charged. The second transistor T2 is turned on, and a reset voltage provided by the sensing line SE is supplied to the first electrode of the first light emitting element EL to reset the first electrode of the first light emitting element EL. The light emitting control line EM(i) provides the low-level signal, and the light emitting control transistor T7 is turned off. At the present stage, the first light emitting element EL does not emit light.

In the light emitting stage, the first scanning line G1(i) and the second scanning line G2(i) provide the low-level signal, and the first transistor T1 and the second transistor T2 of the first sub-pixel circuit are turned off. The light emitting control line EM(i) provides the high-level signal, and the light emitting control transistor T7 is turned on. The high-level signal provided by the first power line PL1 is transmitted to the first electrode of the third transistor T3, and the third transistor T3 provides a driving current to the first light emitting element EL to drive the first light emitting element EL to emit light.

As shown in FIG. 4, after the first sub-pixel circuit of the sub-pixel group completes data writing, the second sub-pixel circuit performs data writing under the control of the first scanning line G1(i+1) and the second scanning line G2(i+1). Under the control of the high-level signal of the light emitting control line EM(i), the light emitting control transistor T7 is turned on, so that the sixth transistor T6 of the second sub-pixel circuit provides the driving current to the second light emitting element EL' to drive the second light emitting element EL' to emit light.

In some exemplary embodiments, description is given by taking completing the compensation operation of the first sub-pixel circuit at the idle phase S2 as an example. At the idle stage S2, the first scanning line G1(i) and the second scanning line G2(i) provide the high-level signal, the first transistor T1 and the second transistor T2 of the first sub-pixel circuit are turned on, a test data voltage provided by the data line D is written into the control electrode of the third transistor T3, and the electrical signal at the second electrode of the third transistor T3 is read through the second transistor T2 and outputted through the sensing line SE, so that an external compensation circuit compensates the mobility of the third transistor T3 through the outputted electrical signal. At the idle phase S2, the light emitting control line EM(i) may keep providing the high-level signal, and the light emitting control transistor T7 is turned on, so that the third transistor T3 may generate the driving current.

In the present exemplary embodiment, the first sub-pixel circuit and the second sub-pixel circuit of a 3T1C structure are electrically connected to one light emitting control transistor, and the light emitting control transistor is controlled to be disconnected at the data writing stage, so as to avoid that the driving transistor generates a current in the data writing process, and ensure that the driving current is provided to the light emitting element at the light emitting stage, which may achieve the high gray level grade and improve the display effect.

Figure 5:
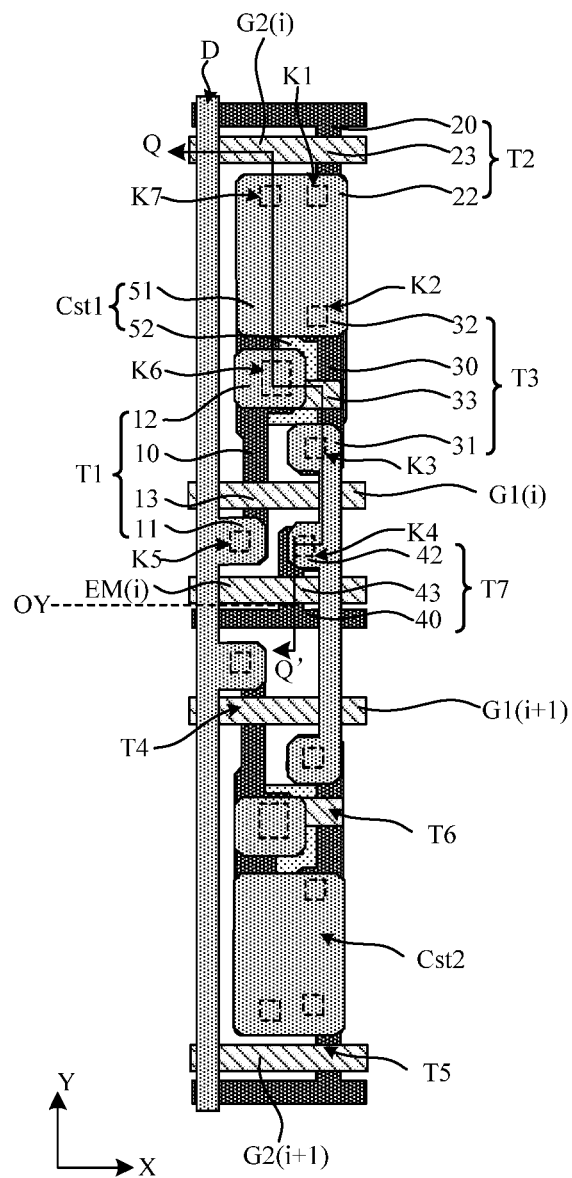
FIG. 5 is a top view of a pixel circuit of a sub-pixel group according to at least one embodiment of the present disclosure.
Figure 6:
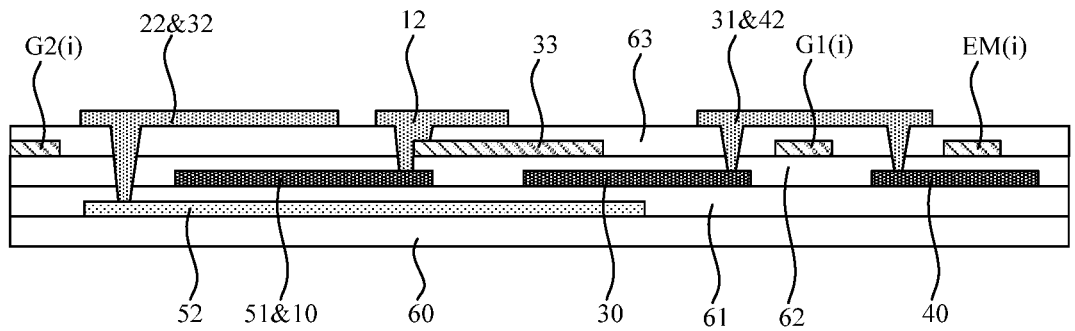
FIG. 6 is a schematic partial sectional view along a Q-Q' direction in FIG. 5.

FIG. 5 is a top view of a pixel circuit of a sub-pixel group according to at least one embodiment of the present disclosure. FIG. 6 is a schematic partial sectional view along a Q-Q' direction in FIG. 5.

In some exemplary embodiments, as shown in FIG. 5, the light emitting control sub-circuit of the sub-pixel group is located between the first sub-pixel circuit and the second sub-pixel circuit in the first direction Y in a plane parallel to the display substrate. The first sub-pixel circuit and the second sub-pixel circuit of the sub-pixel group are symmetrical with respect to the center line OY of the pixel circuit of the sub-pixel group in the first direction Y. In some examples, the center line of the first scanning lines G1(i) and G1(i+1) in the first direction Y coincide with the center line OY. In the present example, the first direction Y crosses the second direction X, for example, the first direction Y is perpendicular to the second direction X. For example, the first direction Y is parallel to a sub-pixel column direction and the second direction X is parallel to a sub-pixel row direction. However, the present embodiment is not limited thereto.

In some exemplary embodiments, as shown in FIG. 5, the length of the pixel circuit of the sub-pixel group in the first direction Y may be less than 200 microns in a plane parallel to the display substrate. The above length may be a distance between a boundary of the active layer 20 of the second transistor T2 of the first sub-pixel circuit of the sub-pixel group away from the second sub-pixel circuit and the boundary of the active layer of the fifth transistor T5 of the second sub-pixel circuit away from the first sub-pixel circuit. The present exemplary embodiment may optimize the space of the pixel circuit.

In some exemplary embodiments, as shown in FIG. 5, the second transistor T2, the third transistor T3, and the first transistor T1 of the first sub-pixel circuit of the sub-pixel group are arranged in sequence in a plane parallel to the display substrate in the first direction Y, and the first storage capacitor Cst1 is located between the second transistor T2 and the third transistor T3. In the first direction Y, the fourth transistor T4, the sixth transistor T6, the second storage capacitor Cst2, and the fifth transistor T5 of the second sub-pixel circuit are arranged in sequence along a side away from the light emitting control transistor T7. The light emitting control transistor T7 is located between the first transistor T1 and the fourth transistor T4 in the first direction Y.

In some exemplary embodiments, as shown in FIGS. 5 and 6, in a plane perpendicular to the display substrate, the display substrate includes the underlay substrate 60, the first conductive layer disposed on the underlay substrate 60, the semiconductor layer, the second conductive layer, and the third conductive layer. A first insulating layer 61 is disposed between the first conductive layer and the semiconductor layer, a second insulating layer 62 is disposed between the semiconductor layer and the second conductive layer, and a third insulating layer 63 is disposed between the second conductive layer and the third conductive layer. In some examples, the first insulating layer 61, the second insulating layer 62 and the third insulating layer 63 may be inorganic insulating layers. In some examples, a fourth insulating layer, a fifth insulating layer, an anode layer, and a pixel define layer may be disposed in sequence on a side of the second conductive layer away from the underlay substrate 60. For example, the fourth insulating layer may be the inorganic insulating layer, and the fifth insulating layer may be an organic insulating layer. However, the present embodiment is not limited thereto.

In some exemplary embodiments, as shown in FIGS. 5 and 6 the first conductive layer at least includes the second electrode of a storage capacitor (e.g. the second electrode 52 of the first storage capacitor Cst1). The semiconductor layer at least includes the active layers of the plurality of transistors (for example, the active layer 10 of the first transistor T1, the active layer 20 of the second transistor T2, the active layer 30 of the third transistor T3, and the active layer 40 of the light emitting control transistor T7), and the first electrode of the storage capacitor (for example, the first electrode 51 of the first storage capacitor Cst1). The first conductive layer at least includes the control electrodes of the plurality of transistors (for example, the control electrode 13 of the first transistor T1, the control electrode 23 of the second transistor T2, the control electrode 33 of the third transistor T3, and the control electrode 43 of the light emitting control transistor T7), the first scanning lines (for example, the first scanning lines G1(i) and G1(i+1)), the second scanning lines (for example, the second scanning lines G2(i) and G2(i+1)), and the light emitting control line (for example, the light emitting control line EM(i)). The second conductive layer may include the data line D, the first power line, the sensing line, and the first electrode and the second electrode of the plurality of transistors (e.g., the first electrode 11 and the second electrode 12 of the first transistor T1, the second electrode 22 of the second transistor T2, the first electrode 31 and the second electrode 32 of the third transistor T3, and the second electrode 42 of the light emitting control transistor T7).

In some exemplary embodiments, the active layer includes a channel region and a first doped region and a second doped region located on both sides of the channel region. The channel region of the active layer has semiconductor characteristics, and the first doped region and the second doped region have conductivity. The first doped region or second doped region of the active layer may be interpreted as a source electrode or drain electrode of the transistor. A part of the active layer between the transistors may be interpreted as a wiring doped with an impurity, and may be used for electrically connecting the transistors. In some examples, a material of the semiconductor layer may include metal oxide, e.g., IGZO. However, the present embodiment is not limited thereto. For example, the material of the semiconductor layer may include, for example, polysilicon.

In some exemplary embodiments, as shown in FIGS. 5 and 6 the control electrode 13 of the first transistor T1 and the first scanning line G1(i) may be of an integral structure. The first electrode 11 of the first transistor T1 and the data line D may be of the integral structure. The first electrode 11 of the first transistor T1 is electrically connected to the first doped region of the active layer 10 of the first transistor T1 through a fifth via hole K5. The second electrode 12 of the first transistor T1 is electrically connected to the second doped region of the active layer 10 of the first transistor T1 through a sixth via hole K6 and electrically connected to the control electrode 33 of the third transistor T3 through the sixth via hole K6. In the present example, the third insulating layer 63 and the second insulating layer 62 within the fifth via hole are etched away to expose a surface of the semiconductor layer. The third insulating layer 63 and the second insulating layer 62 within a half region of the sixth via hole K6 are etched away to expose the surface of the semiconductor layer, and the third insulating layer 63 within the other half region is etched away to expose the surface of the second conductive layer.

In some exemplary embodiments, as shown in FIGS. 5 and 6, the control electrode 23 of the second transistor T2 and the second scanning line G2(i) may be of the integral structure. The second electrode 22 of the second transistor T2 is electrically connected to the second doped region of the active layer 20 of the second transistor T2 through a first via hole K1. The control electrode 33 of the third transistor T3 is located between the first scanning line G1(i) and the second scanning line G2(i). The first electrode 31 of the third transistor T3 is electrically connected to the first doped region of the active layer 30 of the third transistor T3 through a third via hole K3. The second electrode 32 of the third transistor and the second electrode 22 of the second transistor T2 are of the integral structure. The second electrode 32 of the third transistor T3 is electrically connected to the second doped region of the active layer 30 of the third transistor T3 through a second via hole K2 and also electrically connected to the second electrode 52 of the first storage capacitor Cst1 through a seventh via hole K7. In the present example, the third insulating layer 63 and the second insulating layer 62 within the first via hole K1, the second via hole K2, and the third via hole K3 are etched away to expose the surface of the semiconductor layer. The third insulating layer 63, the second insulating layer 62, and the first insulating layer 61 within the seventh via hole K7 are etched away to expose the surface of the first conductive layer.

In some exemplary embodiments, as shown in FIGS. 5 and 6, the control electrode 43 of the light emitting control transistor T7 and the light emitting control line EM(i) may be of the integral structure. The second electrode 42 of the light emitting control transistor T7 is electrically connected to the second doped region of the active layer 40 of the light emitting control transistor T7 through a fourth via hole K4. The second electrode 42 of the light emitting control transistor T7, and the first electrode 31 of the third transistor T3, and the first electrode of the sixth transistor T6 may be of the integral structure. In the present example, the third insulating layer 63 and the second insulating layer 62 within the fourth via hole K4 are etched away to expose the surface of the semiconductor layer.

In some exemplary embodiments, as shown in FIGS. 5 and 6, the first electrode 51 of the first storage capacitor Cst1 and the active layer 10 of the first transistor T1 may be of the integral structure, and the first electrode 51 of the first storage capacitor Cst1 is electrically connected to the second doped region of the active layer 10 of the first transistor T1. The second electrode 52 of the first storage capacitor Cst1 is electrically connected to the second electrode 22 of the second transistor T2 and the second electrode 32 of the third transistor T3. In the present example there is an overlapping between the orthographic projection of the second electrode 52 of the first storage capacitor Cst1 on the underlay substrate 60 and the orthographic projection of the channel region of the active layer 30 of the third transistor T3 on the underlay substrate 60. The second electrode 52 of the first storage capacitor Cst1 may alternatively serve as a light shielding electrode to prevent ambient light from a side of the underlay substrate 60 from affecting the driving transistor (i.e. the third transistor T3). However, the present embodiment is not limited thereto.

In some exemplary embodiments, the structure of the fourth transistor T4 and the structure of the first transistor T1 are substantially symmetrical with respect to the center line OY, the structure of the fifth transistor T5 and the structure of the second transistor T2 are substantially symmetrical with respect to the center line OY, the structure of the sixth transistor T6 and the structure of the third transistor T3 are substantially symmetrical with respect to the center line OY, and the structure of the second storage capacitor Cst2 and the structure of the first storage capacitor Cst1 are substantially symmetrical with respect to the center line OY. Therefore, the structures of the fourth transistor T4, the fifth transistor T5, the sixth transistor T6, and the second storage capacitor Cst2 may be referred to the structures of the first transistor T1, the second transistor T2, the third transistor T3, and the first storage capacitor Cst1, and will not be repeated here.

Figure 7:
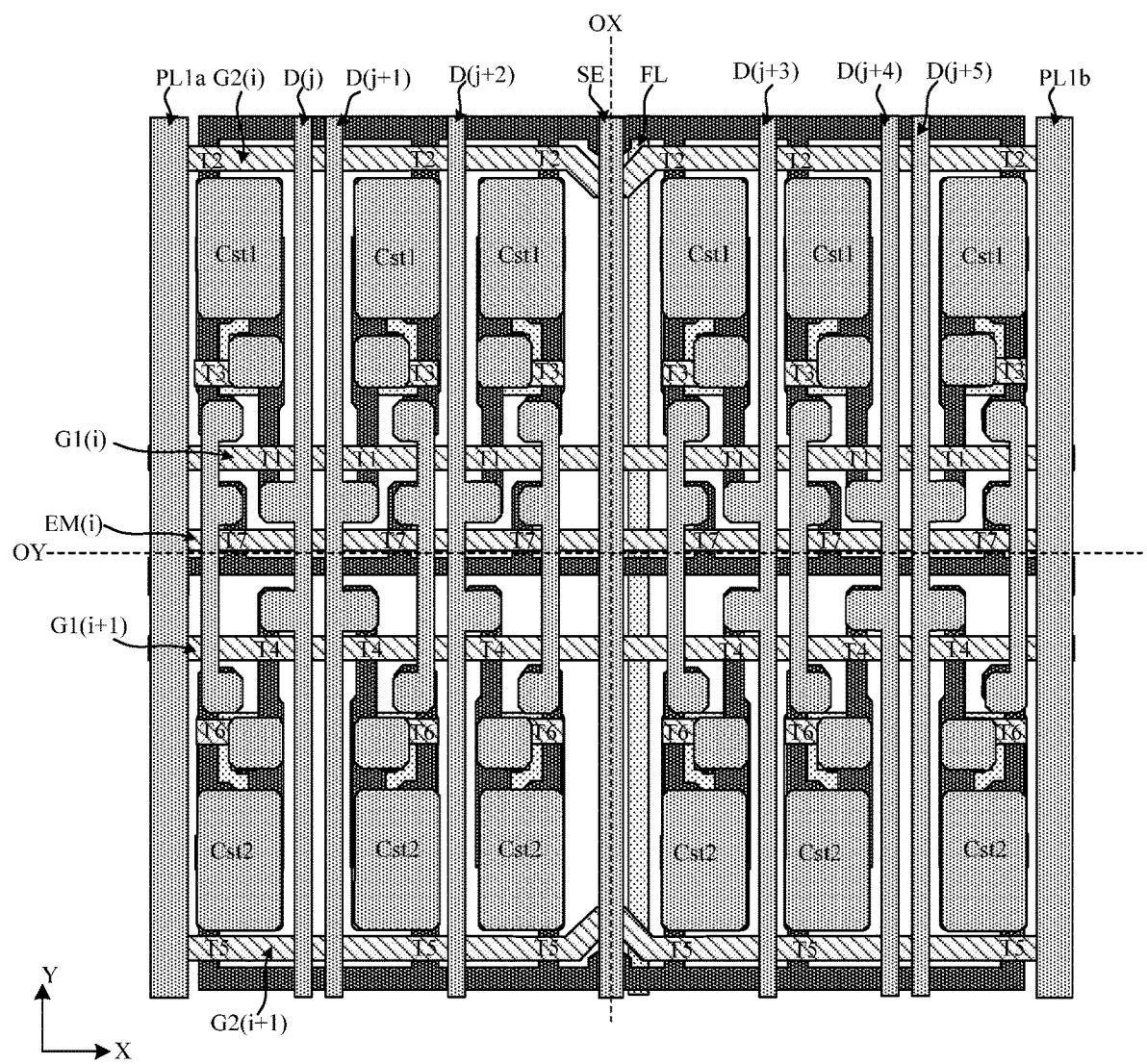
FIG. 7 is a top view of a pixel circuit of one pixel unit group according to at least one embodiment of the present disclosure.

FIG. 7 is a top view of a pixel circuit of a pixel unit group according to at least one embodiment of the present disclosure. In some examples, one pixel unit group includes six sub-pixel groups (e.g. a j-th column sub-pixel group to a (j+5)-th column sub-pixel group, wherein j is a positive integer). Each sub-pixel group includes the first sub-pixel circuit, the light emitting control sub-circuit, and the second sub-pixel circuit arranged in sequence along the first direction Y.

Figure 8:
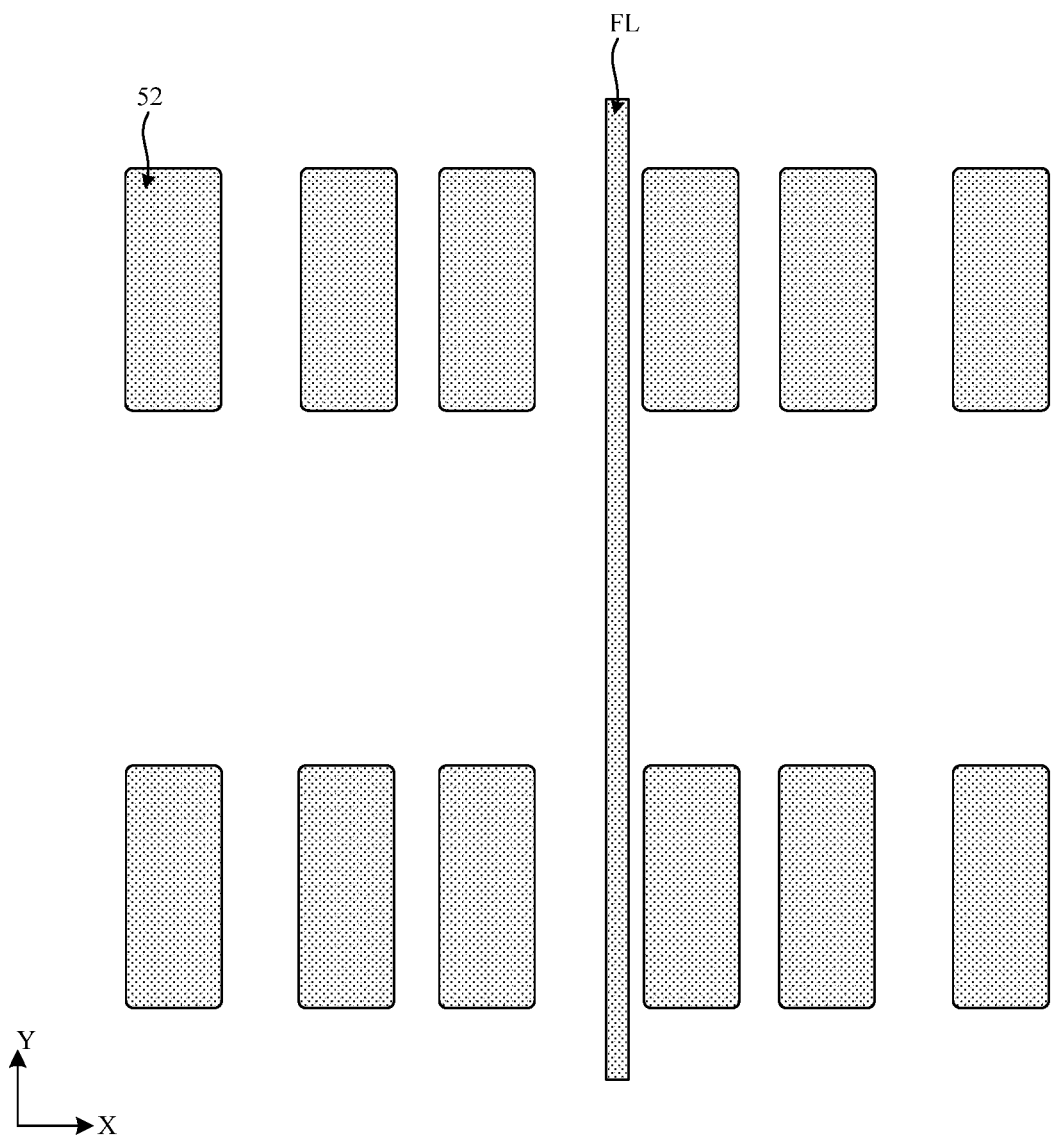
FIG. 8 is a top view of a pixel circuit of a pixel unit group after a first conductive layer is formed according to at least one embodiment of the present disclosure.
Figure 9:
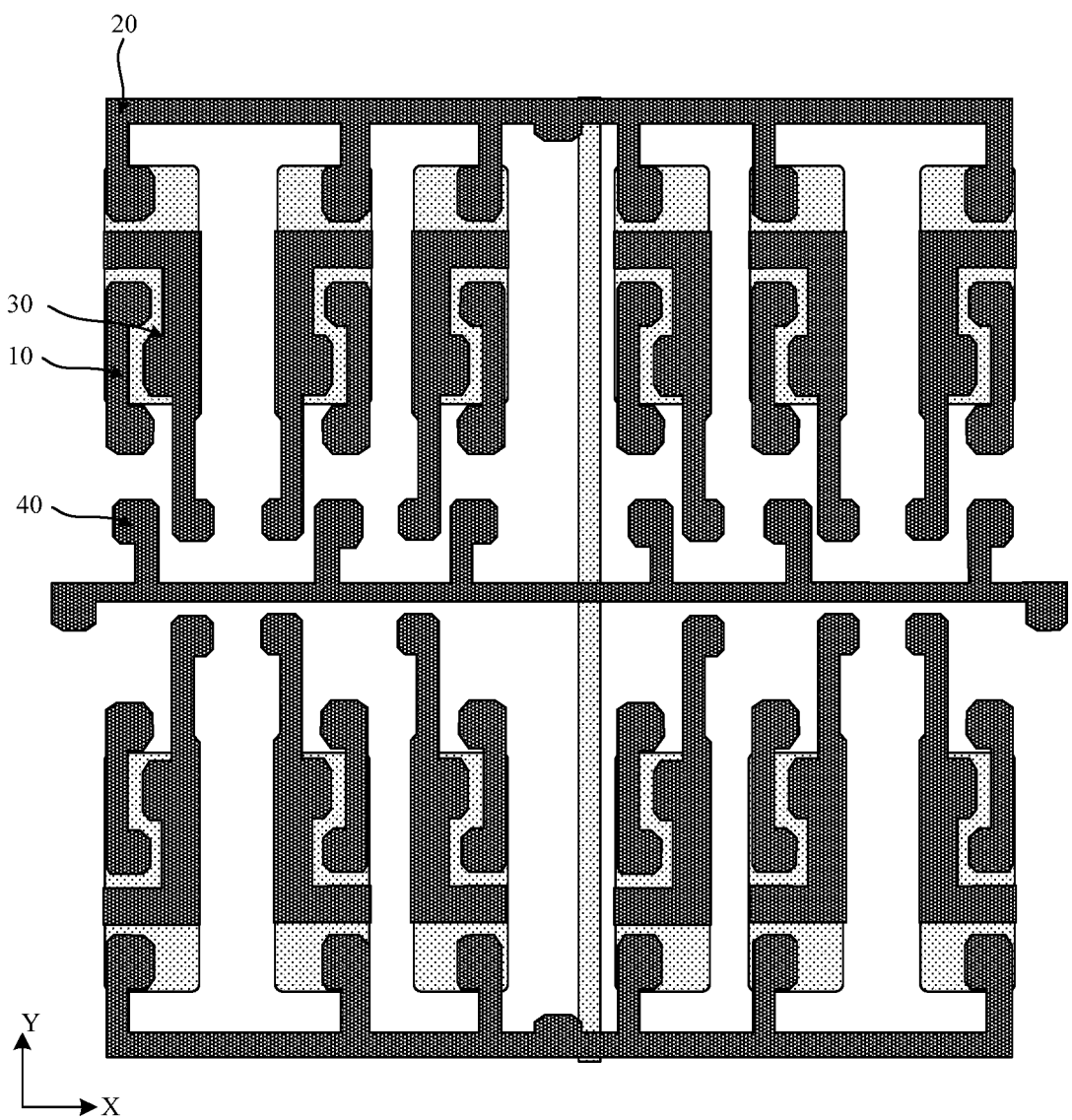
FIG. 9 is a top view of a pixel circuit of a pixel unit group after a semiconductor layer is formed according to at least one embodiment of the present disclosure.
Figure 10:
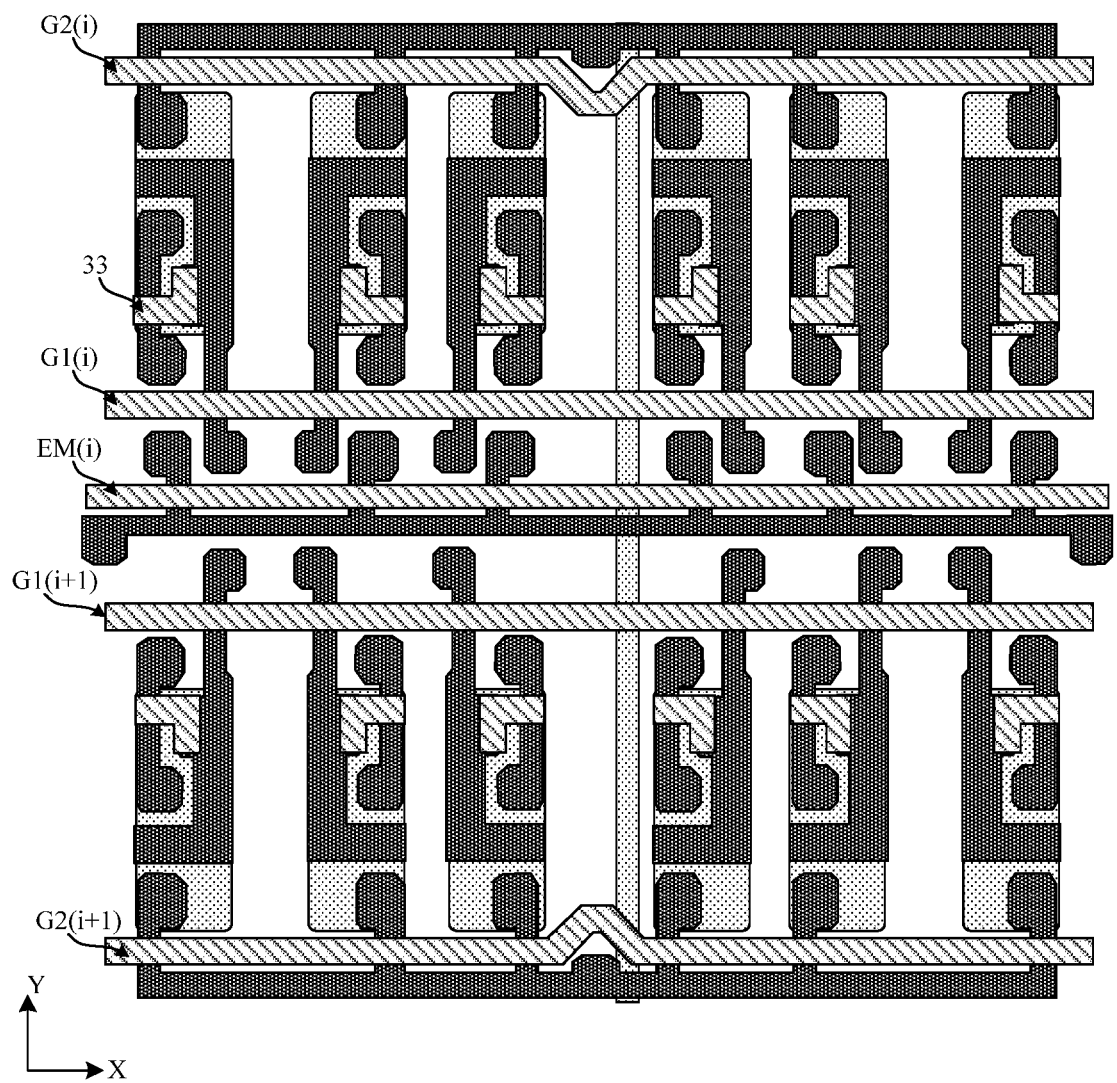
FIG. 10 is a top view of a pixel circuit of a pixel unit group after a second conductive layer is formed according to at least one embodiment of the present disclosure.
Figure 11:
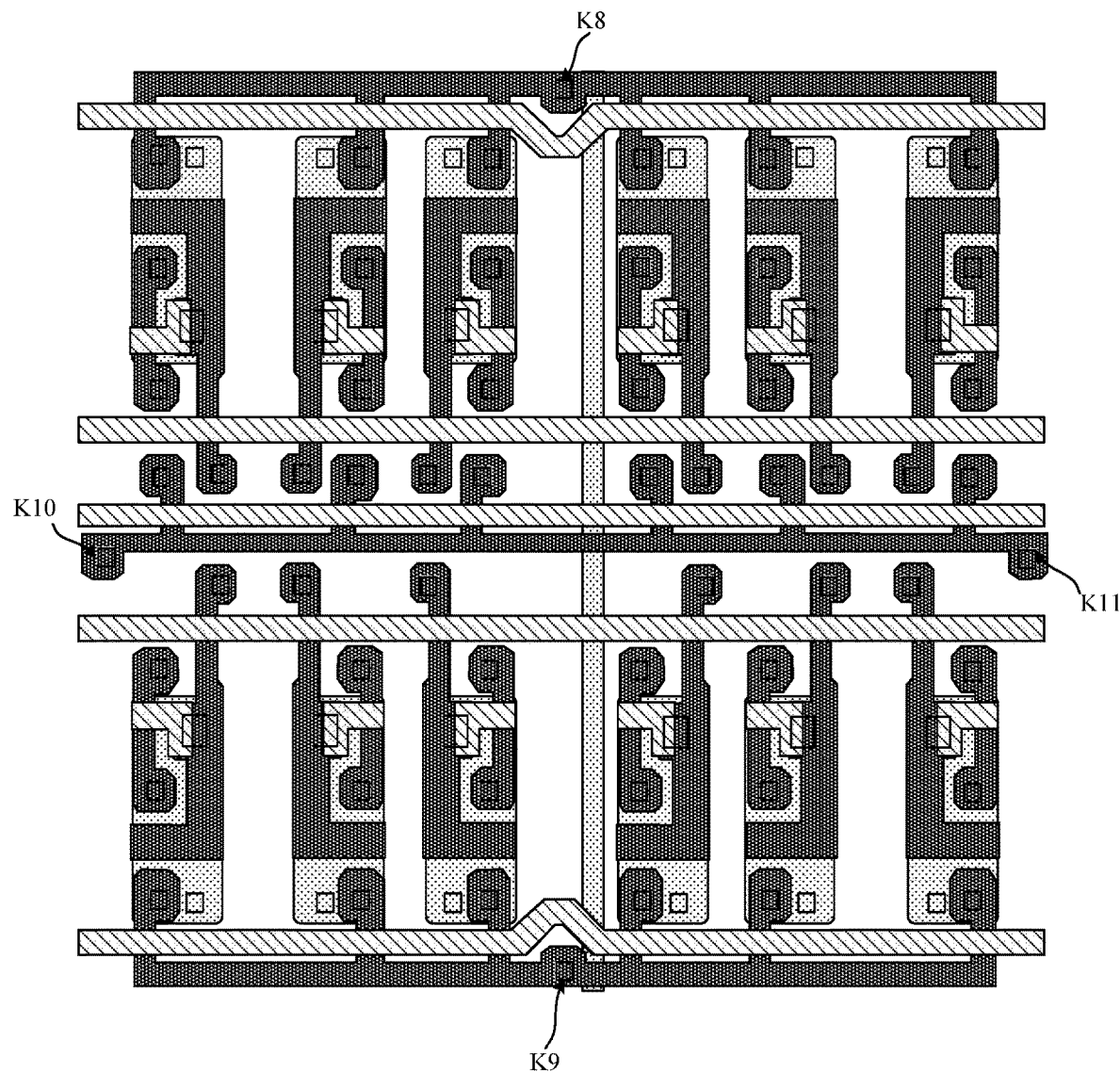
FIG. 11 is a top view of a pixel circuit of a pixel unit group after a third insulating layer is formed according to at least one embodiment of the present disclosure.
Figure 12:
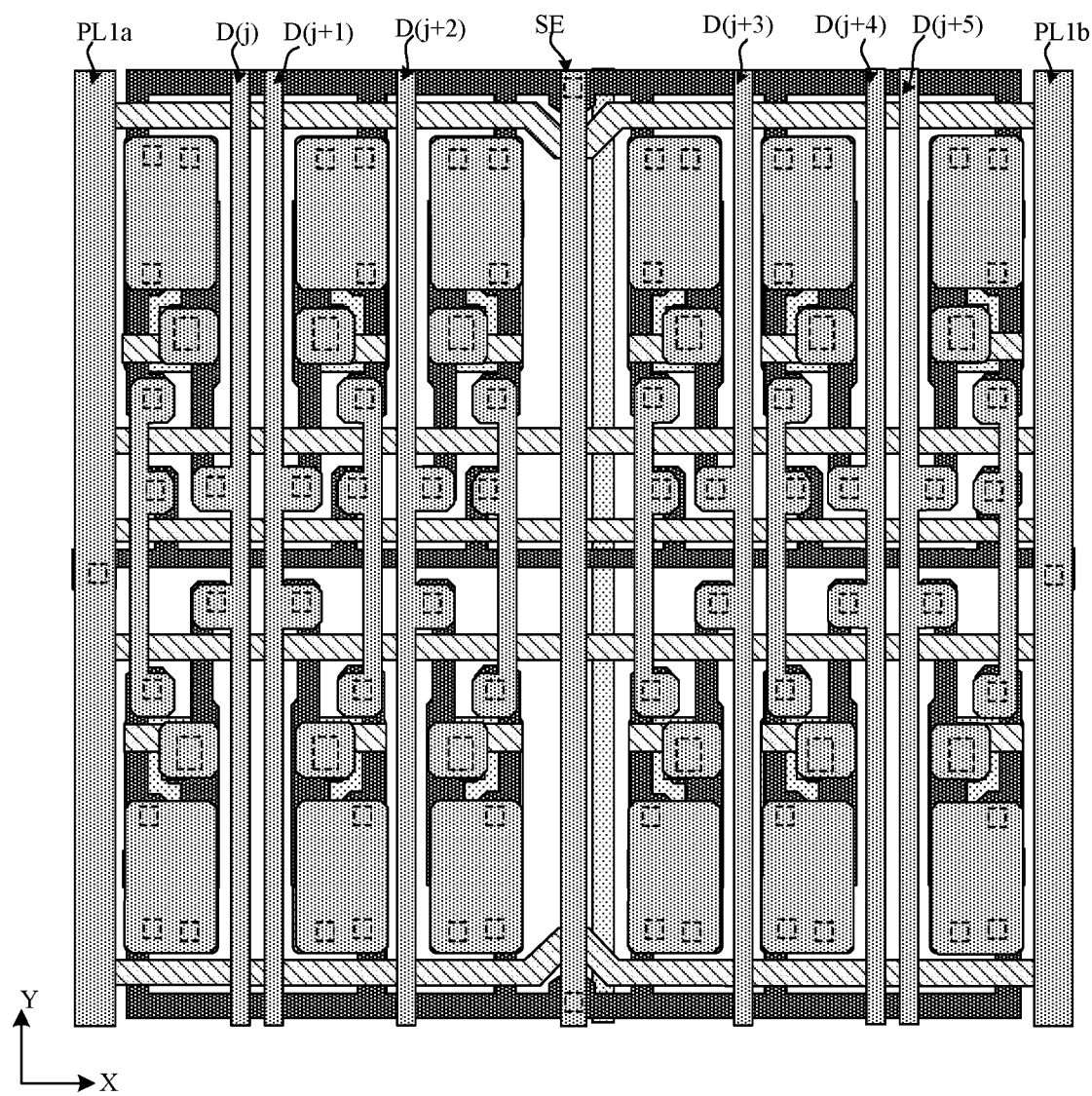
FIG. 12 is a top view of a pixel circuit of a pixel unit group after a third conductive layer is formed according to at least one embodiment of the present disclosure.

FIG. 8 is a top view of a pixel circuit of a pixel unit group after a first conductive layer is formed according to at least one embodiment of the present disclosure. FIG. 9 is a top view of a pixel circuit of a pixel unit group after a semiconductor layer is formed according to at least one embodiment of the present disclosure. FIG. 10 is a top view of a pixel circuit of a pixel unit group after a second conductive layer is formed according to at least one embodiment of the present disclosure. FIG. 11 is a top view of a pixel circuit of a pixel unit group after a third insulating layer is formed according to at least one embodiment of the present disclosure. FIG. 12 is a top view of a pixel circuit of a pixel unit group after a third conductive layer is formed according to at least one embodiment of the present disclosure.

In some exemplary embodiments, as shown in FIG. 7, in a plane parallel to the display substrate, the first scanning lines G1(i) and G1(i+1), the second scanning lines G2(i) and G2(i+1), and the light emitting control line EM(i) all extend along the second direction X. In the first direction Y, the light emitting control line EM(i) is located between the first scanning line G1(i) and the first scanning line G1(i+1). The plurality of data lines, the two first power lines PL1a and PL1b, the sensing line SE, and the first auxiliary power line FL all extend along the first direction Y. In the second direction X, the first power line PL1a, three data lines (for example, data lines D(j), D(j+1), and D(j+2)), the sensing line SE, the first auxiliary power line FL, three data lines (for example, data lines D(j+3), D(j+4), and D(j+5)), and the first power line PL1b are arranged in sequence. However, the present embodiment is not limited thereto.

In some exemplary embodiments, as shown in FIG. 7, a first pixel circuit and a second pixel circuit of the plurality of sub-pixel groups within the pixel unit group are symmetrical with each other with respect to the center line OY of the pixel circuit of the sub-pixel group in the first direction Y in a plane parallel to the display substrate. The pixel circuits of the pixel unit group are symmetrical with each other with respect to the center line OX of the pixel circuits of the pixel unit group in the second direction X. However, the present embodiment is not limited thereto.

In some exemplary embodiments, as shown in FIG. 7, in the second direction X, one first power line is respectively disposed on both sides of the pixel unit group, for example, the first power line PL1a is disposed on the left side and the first power line PL1b is disposed on the right side. In other words, the first power line is located between adjacent pixel unit groups. The first power lines PL1a and PL1b extend along the first direction Y and are arranged in sequence along the second direction X. However, the present embodiment is not limited thereto.

In some exemplary embodiments, as shown in FIG. 7, one sensing line SE and one first auxiliary power line FL are disposed between adjacent sub-pixel groups within the pixel unit group. For example, the sensing line SE and the first auxiliary power line FL are located between the third sub-pixel group and the fourth sub-pixel group of the pixel unit group. The sensing line SE and the first auxiliary power line FL both extend along the first direction Y and are arranged along the second direction X. The orthographic projection of the first auxiliary power line FL on the underlay substrate 60 and the orthographic projection of the sensing line SE on the underlay substrate 60 do not overlap. The orthographic projection of the first auxiliary power line FL on the underlay substrate 60 is located on a side of the orthographic projection of the sensing line SE on the underlay substrate 60, for example, on a side close to the (j+3)-th column sub-pixel group. However, the present embodiment is not limited thereto. In the present exemplary embodiment, in the second direction X, the first power lines and the sensing lines are arranged at intervals, and three sub-pixel groups are disposed between the first power line and the sensing line which are adjacent.

In some exemplary embodiments, as shown in FIGS. 7 and 8, the first conductive layer of the display region may include the first auxiliary power line FL, the second electrode 52 of the first storage capacitor Cst1, and the second electrode of the second storage capacitor Cst2. In the present example, the second electrodes of the first storage capacitor and the second storage capacitor may serve as the light shielding electrodes. The orthographic projection of the second electrode 52 of the first storage capacitor on the underlay substrate may cover the orthographic projection of the channel region of the active layer of the third transistor on the underlay substrate, and the orthographic projection of the second electrode of the second storage capacitor on the underlay substrate may cover the orthographic projection of the channel region of the active layer of the sixth transistor on the underlay substrate to avoid influence of ambient light on the channel region.

In some exemplary embodiments, as shown in FIGS. 7 and 9, the semiconductor layer of the display region may include the active layer of the plurality of transistors of the pixel circuit, the first electrode of the first storage capacitor, and the first electrode of the second storage capacitor. In the present example, the active layers 20 of the second transistors of the pixel circuits of the plurality of sub-pixel groups of the pixel unit group may be of the integral structure. The first doped regions of the active layers 20 of the second transistors of the pixel circuits of the plurality of sub-pixel groups of the pixel unit group are electrically connected to each other. The active layer 10 of the first transistor and the active layer 30 of the third transistor of the pixel circuit of the sub-pixel group are adjacent in the second direction X. The active layer 40 of the light emitting control transistor of the pixel circuit of the plurality of sub-pixel groups of the pixel unit group may be of the integral structure. The first doped regions of the active layer 40 of the light emitting control transistors of the pixel circuits of the plurality of sub-pixel groups may be electrically connected to each other. The first electrode of the first storage capacitor and the active layer of the first transistor may be of the integral structure, and the first electrode of the second storage capacitor and the active layer of the fourth transistor may be of an integral structure.

In some exemplary embodiments, as shown in FIGS. 7 and 10, the second conductive layer of the display region may include the control electrodes of the plurality of transistors of the pixel circuit, a plurality of first scanning lines, a plurality of second scanning lines, and a plurality of light emitting control lines. The control electrode of the first transistor of the pixel circuit of the plurality of sub-pixel groups of the pixel unit group in a same row and one first scanning line may be of an integral structure, the control electrode of the second transistor of the pixel circuit of the plurality of sub-pixel groups of the pixel unit group in the same row and one second scanning line may be of an integral structure, the control electrode of the fourth transistor of the pixel circuit of the plurality of sub-pixel groups of the pixel unit group in the same row and one first scanning line may be of an integral structure, and the control electrode of the fifth transistor of the pixel circuit of the plurality of sub-pixel groups of the pixel unit group in the same row and one second scanning line may be of an integral structure. The control electrode of the light emitting control transistor of the plurality of sub-pixel groups of the pixel unit group in the same row and one light emitting control line may be of an integral structure. For example, the control electrode of the first transistor of the first sub-pixel circuit of the sub-pixel group and the first scanning line G1(i) may be of an integral structure, and the control electrode of the fourth transistor of the second sub-pixel circuit of the sub-pixel group and the first scanning line G1(i+1) may be of an integral structure; the control electrode of the second transistor of the first sub-pixel circuit and the second scanning line G2(i) may be of an integral structure, and the control electrode of the fifth transistor of the second sub-pixel circuit and the first scanning line G2(i+1) may be of an integral structure; the control electrode of the light emitting control transistor of the light emitting control sub-circuit and the light emitting control line EM(i) may be of an integral structure. However, the present embodiment is not limited thereto.

In some exemplary embodiments, as shown in FIGS. 7, 11, and 12, the third conductive layer may include a plurality of first power lines, a plurality of data lines, the sensing line SE, and the first electrodes and the second electrodes of the plurality of transistors of the pixel circuit. The sensing line SE is electrically connected to the first doped region of the active layer 20 of the second transistor of the first sub-pixel circuit through an eighth via hole K8 and electrically connected to the first doped region of the active layer of the second transistor of the second sub-pixel circuit through a ninth via hole K9. In the present example, one sensing line SE is electrically connected to the pixel circuits of the plurality of sub-pixel groups of one pixel unit group. The first power line PL1a is electrically connected to the first doped region of the active layer of the light emitting control transistor T7 of the light emitting control sub-circuit through a tenth via hole K10, and the first power line PL1b is electrically connected to the first doped region of the active layer of the light emitting control transistor T7 of the light emitting control sub-circuit through an eleventh via hole K11.

In some exemplary embodiments, as shown in FIGS. 7 to 12, one pixel unit group includes six sub-pixel groups arranged in sequence along the second direction X, wherein two data lines (i.e. the data lines D(j) and D(j+1)) are disposed between the first sub-pixel group and the second sub-pixel group, and one data line (i.e. the data line D(j+2)) is disposed between the second sub-pixel group and the third sub-pixel group. The pixel circuit of the first sub-pixel group and the pixel circuit of the second sub-pixel group are substantially symmetrical with respect to the center line of both of them in the second direction X. For example, the center line of the pixel circuit of the first sub-pixel group and the pixel circuit of the second sub-pixel group in the second direction X may coincide with the center line of the data lines D(j) and D(j+1) in the second direction X. However, the present embodiment is not limited thereto. In the present example, the structures of the pixel circuit of the second sub-pixel group and the pixel circuit of the third sub-pixel group may be substantially same, so they will not be repeated here. The pixel circuits of the pixel unit group are substantially symmetrical with respect to the center line OX of the pixel circuits of the pixel unit group in the second direction X.

The display substrate provided by the present exemplary embodiment may reduce a quantity of the light emitting control lines by disposing the sub-pixel groups sharing the light emitting control sub-circuits, thereby optimizing spatial arrangement and effectively increasing resolution.

Figure 13:
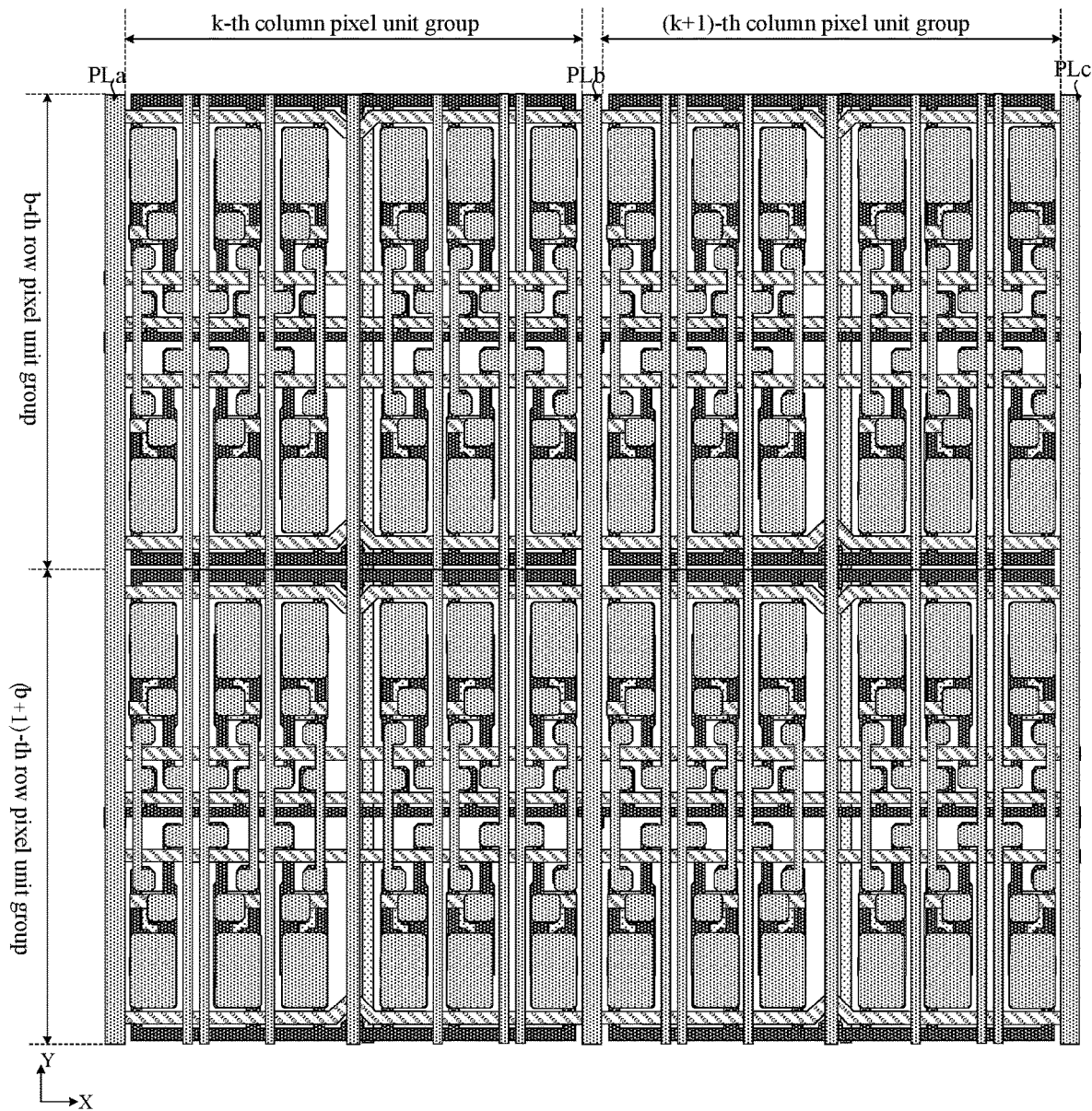
FIG. 13 is a top view of a pixel circuit of a plurality of pixel unit groups according to at least one embodiment of the present disclosure.

FIG. 13 is a top view of a pixel circuit of a plurality of pixel unit groups according to at least one embodiment of the present disclosure. FIG. 13 illustrates four pixel unit groups arranged in two rows and two columns (for example, the b-th row, k-th column pixel unit group, the b-th row, (k+1)-th column pixel unit group, the (b+1)-th row, k-th column pixel unit group, the (b+1)-th row, (k+1)-th column pixel unit group, wherein b and k are both integers). As shown in FIG. 13, in the second direction X, two adjacent pixel unit groups share one first power line. For example, the b-th row, k-th column pixel unit group and the b-th row, (k+1)-th column pixel unit group share the first power line PL1b. However, the present embodiment is not limited thereto.

Figure 14:
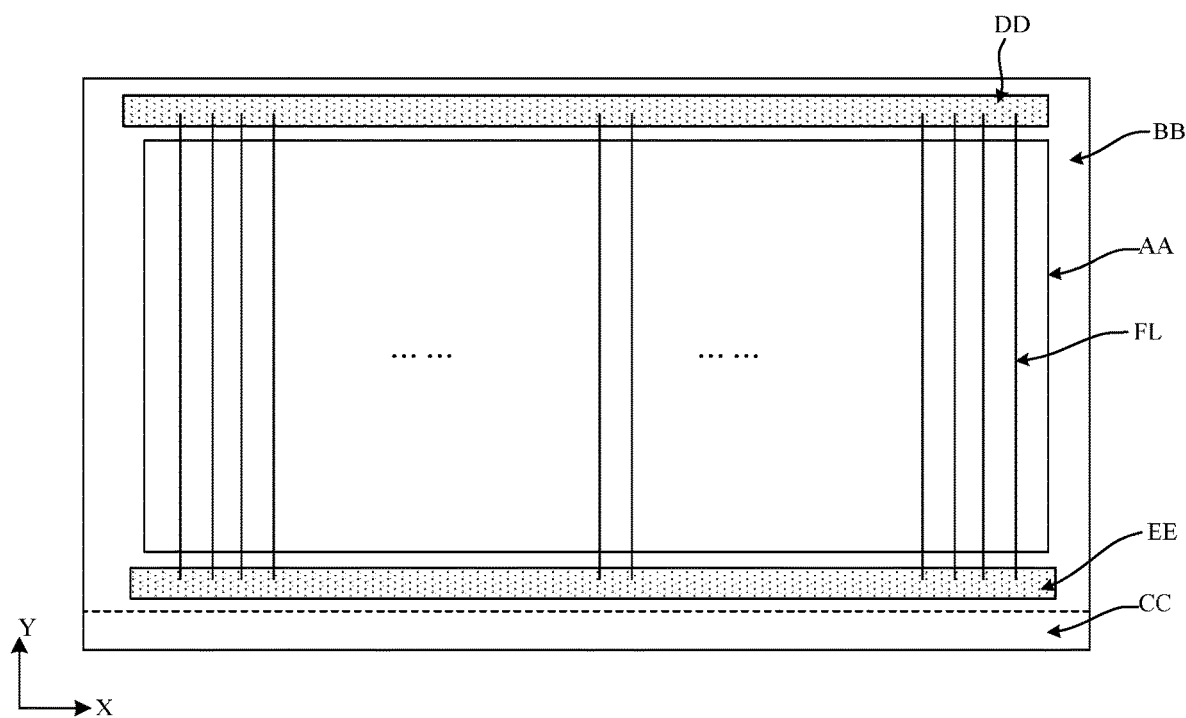
FIG. 14 is a schematic diagram of an arrangement of a first auxiliary power line according to at least one embodiment of the present disclosure.

FIG. 14 is a schematic diagram of an arrangement of a first auxiliary power line according to at least one embodiment of the present disclosure. In some exemplary embodiments, as shown in FIG. 14, the display substrate includes the display region AA and the frame region BB located on the periphery of the display region AA. The frame region BB has a first connection region DD and a second connection region EE. The display region AA is disposed with a plurality of first auxiliary power lines FL. The plurality of first auxiliary power lines FL extend along the first direction Y and are arranged along the second direction X. For example, at least one first auxiliary power line FL is located between adjacent sub-pixel groups within the pixel unit group, for example, three sub-pixel groups may be disposed between two adjacent first auxiliary power lines FL in the second direction X. The first auxiliary power line FL may extend from the display region AA to the first connection region DD and the second connection region EE along the first direction Y. In the first connection region DD and the second connection region EE, the first auxiliary power line FL may be electrically connected to the second electrodes of the first light emitting element and the second light emitting element through a connection electrode. In some examples, the first auxiliary power line FL is located in the first conductive layer and may be electrically connected to the second electrodes of the first light emitting element and the second light emitting element through the connection electrodes located in the third conductive layer and the anode layer. The first auxiliary power line of the present embodiment may play a role in reducing resistances of the second electrodes of the first light emitting element and the second light emitting element, thereby reducing the IR drop of the second power line.

The structure of the display substrate will be described below through an example of a manufacturing process of the display substrate. The "patterning process" mentioned in the present disclosure includes processes, such as film layer deposition, photoresist coating, masking and exposure, development, etching, and photoresist stripping. Any one or more of sputtering, evaporation and chemical vapor deposition may be used for deposition, any one or more of spray coating and spin coating may be used for coating, and any one or more of dry etching and wet etching may be used for etching. A "thin film" refers to a layer of thin film manufactured with a certain material on an underlay substrate using a deposition or coating process. If the "thin film" does not need the patterning process in the entire manufacturing process, the "thin film" may also be called a "layer". If the "thin film" needs the patterning process in the entire manufacturing process, the "thin film" is called a "thin film" before the patterning process is performed and is called a "layer" after the patterning process is performed. The "layer" after the patterning process includes at least one "pattern".

"A and B are arranged in the same layer" mentioned in the present disclosure refers to that A and B are simultaneously formed by the same patterning process. The "thickness" of the film layer is a size of the film layer in a direction perpendicular to the display substrate. In the exemplary embodiment of the present disclosure, "the projection of A includes the projection of B" refers to that a boundary of the projection of B falls within a range of a boundary of the projection of A or the boundary of the projection of A is overlapped with the boundary of the projection of B.

In some exemplary embodiments, a process for preparing the display substrate may include following operations, as shown in FIGS. 5 to 12. In the present exemplary embodiment, description is given by taking the display substrate as a top emission type display substrate and by taking one pixel unit group as an example.

(1) A pattern of a first conductive layer is formed.

In some exemplary embodiments, a first conductive thin film is deposited on the underlay substrate 60, and the first conductive thin film is patterned through a patterning process, forming the pattern of the first conductive layer. As shown in FIG. 8 the first conductive layer may include the first auxiliary power line FL the second electrode 52 of the first storage capacitor, and the second electrode of the second storage capacitor. In the present example, the second electrode 52 of the first storage capacitor and the second electrode of the second storage capacitor may serve as the light shielding electrodes, protecting the channel region of the active layer of the driving transistor of the pixel circuit.

In some exemplary embodiments, an underlay substrate 60 may be a rigid substrate or a flexible substrate. The rigid substrate may include one or more of glass and metal foil sheet. The flexible substrate may include one or more of polyethylene terephthalate, ethylene terephthalate, polyether ether ketone, polystyrene, polycarbonate, polyarylate, polyarylester, polyimide, polyvinyl chloride, polyethylene, and textile fiber. However, the present embodiment is not limited thereto.

(2) A pattern of a semiconductor layer is formed.

In some exemplary embodiments, a first insulating thin film and a semiconductor thin film are deposited in sequence on the underlay substrate 60 on which the aforementioned pattern is formed, and the semiconductor thin film is patterned through the patterning process, forming the first insulating layer 61 and the pattern of the semiconductor layer formed on the first insulating layer 61. As shown in FIG. 9, the semiconductor layer may have a curved or bent shape. The semiconductor layer may include the active layer of the plurality of transistors of the pixel circuit, the first electrode of the first storage capacitor, and the first electrode of the second storage capacitor. In the present example, the active layer of the first transistor of the first sub-pixel circuit and the first electrode of the first storage capacitor may be of an integral structure, and the active layer of the fourth transistor of the second sub-pixel circuit and the first electrode of the second storage capacitor may be of an integral structure.

(3) A pattern of a second conductive layer is formed.

In some exemplary embodiments, a second insulating thin film and a second conductive thin film are deposited in sequence on the underlay substrate 60 on which the aforementioned patterns are formed, and the second conductive thin film is patterned through the patterning process, forming the second insulating layer 62, and the second conductive layer formed on the second insulating layer 62. As shown in FIG. 10, the second conductive layer may include the control electrodes of the plurality of transistors of the pixel circuit, a plurality of first scanning lines, a plurality of second scanning lines, and a plurality of light emitting control lines.

(4) A pattern of a third conductive layer is formed.

In some exemplary embodiments, a third insulating thin film is deposited on the underlay substrate 60 on which the aforementioned patterns are formed, and the third insulating thin film is patterned through the patterning process, forming the pattern of the third insulating layer 63. A plurality of via hole patterns are opened on the third insulating layer. For example, the third insulating layer 63 and the second insulating layer 62 within the first via hole K1, the second via hole K2, the third via hole K3, the fourth via hole K4, the fifth via hole K5, the eighth via hole K8 to the eleventh via hole K11 are etched away to expose the surface of the semiconductor layer; the third insulating layer 63 and the second insulating layer 62 within the half region of the sixth via hole K6 are etched away to expose the surface of the semiconductor layer, and the third insulating layer 63 in the other half region is etched away to expose the surface of the second conductive layer; and the third insulating layer 63, the second insulating layer 62, and the first insulating layer 61 within the seventh via hole K7 are etched away to expose the surface of the first conductive layer. The orthographic projection of the plurality of via holes on the underlay substrate 60 may be rectangular or circular. However, the present embodiment is not limited thereto.

In some exemplary embodiments, a third conductive thin film is deposited on the underlay substrate 60 on which the aforementioned patterns are formed, and the third conductive thin film is patterned through the patterning process, forming the pattern of the third conductive layer on the third insulating layer 63. As shown in FIG. 12, the third conductive layer may include a plurality of first power lines, a plurality of data lines, the sensing line SE, and the first electrodes and the second electrodes of the plurality of transistors of the pixel circuit.

In some exemplary embodiments, a fourth insulating thin film is deposited on the underlay substrate 60 on which the aforementioned patterns are formed, forming the fourth insulating layer. Then, a fifth insulating thin film is coated, and the pattern of the fifth insulating layer is formed by masking, exposuring and developing for the fifth insulating thin film. A plurality of via holes exposing the fourth insulating layer are opened on the fifth insulating layer. Then, the exposed fourth insulating layer is etched to form a plurality of via holes on the fourth insulating layer to expose the surface of the third conductive layer.

In some exemplary implementations, a fourth conductive thin film is deposited on the underlay substrate 60 on which the aforementioned patterns are formed, and the fourth conductive thin film is patterned through the patterning process, forming the pattern of the anode layer on the fifth insulating layer. The anode layer at least includes the first electrode of the first light emitting element of the sub-pixel group, and the first electrode of the second light emitting element. The first electrode of the first light emitting element may be electrically connected to the second electrode of the third transistor of the first sub-pixel circuit through the via hole on the fourth insulating layer and the fifth insulating layer. The first electrode of the second light emitting element may be electrically connected to the second electrode of the sixth transistor of the second sub-pixel circuit through the via hole on the fourth insulating layer and the fifth insulating layer. In some examples, the anode layer may be made of any one or more of magnesium (Mg), silver (Ag), aluminum (Al), copper (Cu), and lithium (Li), or an alloy made of any one or more of the above metals.

In some exemplary embodiments, a pixel define thin film is coated on the underlay substrate 60 on which the aforementioned patterns are formed, and the pattern of the pixel define layer is formed through masking, exposure, and development processes. The pixel define layer of each sub-pixel group is formed with a first pixel opening exposing the first electrode of the first light emitting element, and a second pixel opening exposing the second electrode of the second light emitting element.

In some exemplary embodiments, a first organic light emitting layer of the first light emitting element may be formed within the formed first pixel opening, wherein the first organic light emitting layer is electrically connected to the first electrode of the first light emitting element; and a second organic light emitting layer of the second light emitting element is formed within the formed second pixel opening, wherein the second organic light emitting layer is electrically connected to the first electrode of the second light emitting element. Afterwards, a transparent conductive thin film is deposited, and the transparent conductive thin film is patterned through the patterning process, forming the patterns of the second electrode of the first light emitting element and the second electrode of the second light emitting element. For example, the second electrodes of the first light emitting element and the second light emitting element may be made of a transparent conductive material such as indium tin oxide (ITO) or indium zinc oxide (IZO). Afterwards, an encapsulating layer may be formed on the second electrodes of the first light emitting element and the second light emitting element. The encapsulating layer may include a stacked structure of an inorganic material/organic material/inorganic material. However, the present embodiment is not limited thereto.

In some exemplary embodiments, the first conductive layer, the second conductive layer, and the third conductive layer may be made of metal materials, e.g., any one or more of Argentum (Ag), Copper (Cu), Aluminum (Al), and Molybdenum (Mo), or alloy materials of the aforementioned metals, e.g., an Aluminum-Neodymium alloy (AlNd) or a Molybdenum-Niobium alloy (MoNb), and may be single-layer structures, or multilayer composite structures such as Mo/Cu/Mo. In some examples, the light shielding performance of the metal material used by the first conductive layer may be stronger than that of the metal material used by the second conductive layer and the third conductive layer. The first insulating layer 61, the second insulating layer 62, the third insulating layer 63, and the fourth insulating layer may be made of any one or more of silicon oxide (SiOx), silicon nitride (SiNx), and silicon oxynitride (SiON), and may be single layer, multi-layer, or composite layers. The fifth insulating layer and the pixel define layer may be made of the organic material, such as polyimide, acrylic, or polyethylene terephthalate, etc. The semiconductor layer may be made of metal oxide or polysilicon. However, the present embodiment is not limited thereto.

The shown structure and its preparing process in the present disclosure are only exemplary description. In some exemplary implementations, changes in corresponding structures and addition or deletion of the patterning process may be made as practically required. For example, the pixel circuit and the first electrode of the first light emitting element and the first electrode of the second light emitting element may be electrically connected through the connection electrode. However, the present disclosure is not limited thereto.

The preparing process according to the present disclosure may be implemented by using an existing mature preparing equipment, may be well compatible with the existing preparing process, and has advantages of simple process realization, easy practicing, high production efficiency, low production cost, and high yield rate.

Figure 15:
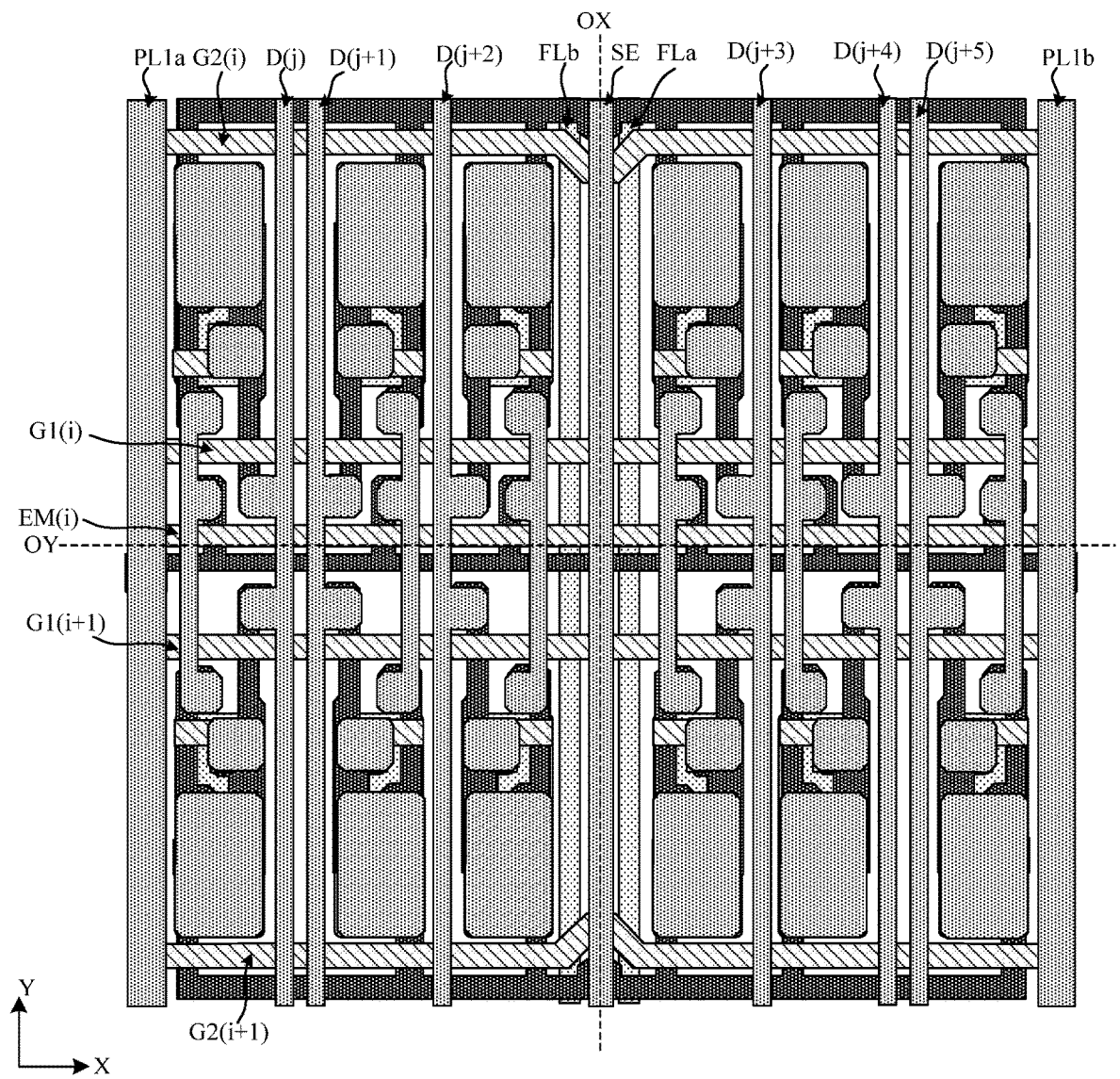
FIG. 15 is another top view of a pixel circuit of a pixel unit group according to at least one embodiment of the present disclosure.

FIG. 15 is another top schematic diagram of a pixel circuit of a pixel unit group according to at least one embodiment of the present disclosure. In some exemplary embodiments as shown in FIG. 15, two first auxiliary power lines FLa and FLb and one sensing line SE are disposed between adjacent sub-pixel groups within the pixel unit group. For example, the pixel unit group includes six sub-pixel groups arranged in sequence along the second direction X, wherein two first auxiliary power lines FLa and FLb and one sensing line SE may be located between the third sub-pixel group and the fourth sub-pixel group of the pixel unit group. Two first auxiliary power lines FLa and FLb are located in the first conductive layer, and the sensing line SE is located in the third conductive layer. The orthographic projections of the two first auxiliary power lines FLa and FLb on the underlay substrate may be located respectively on two sides of the orthographic projection of the sensing line SE opposite to each other on the underlay substrate in the second direction X. The orthographic projections of the two first auxiliary power lines FLa and FLb on the underlay substrate and the orthographic projection of the sensing line SE on the underlay substrate may not overlap.

In the present exemplary embodiment, by disposing two first auxiliary power lines between adjacent sub-pixel groups within the pixel unit group, the IR drop of the second power line may be further reduced.

For other structures of the display substrate of this embodiment, reference may be made to the description of the aforementioned embodiments, so it will not be repeated here.

Figure 16:
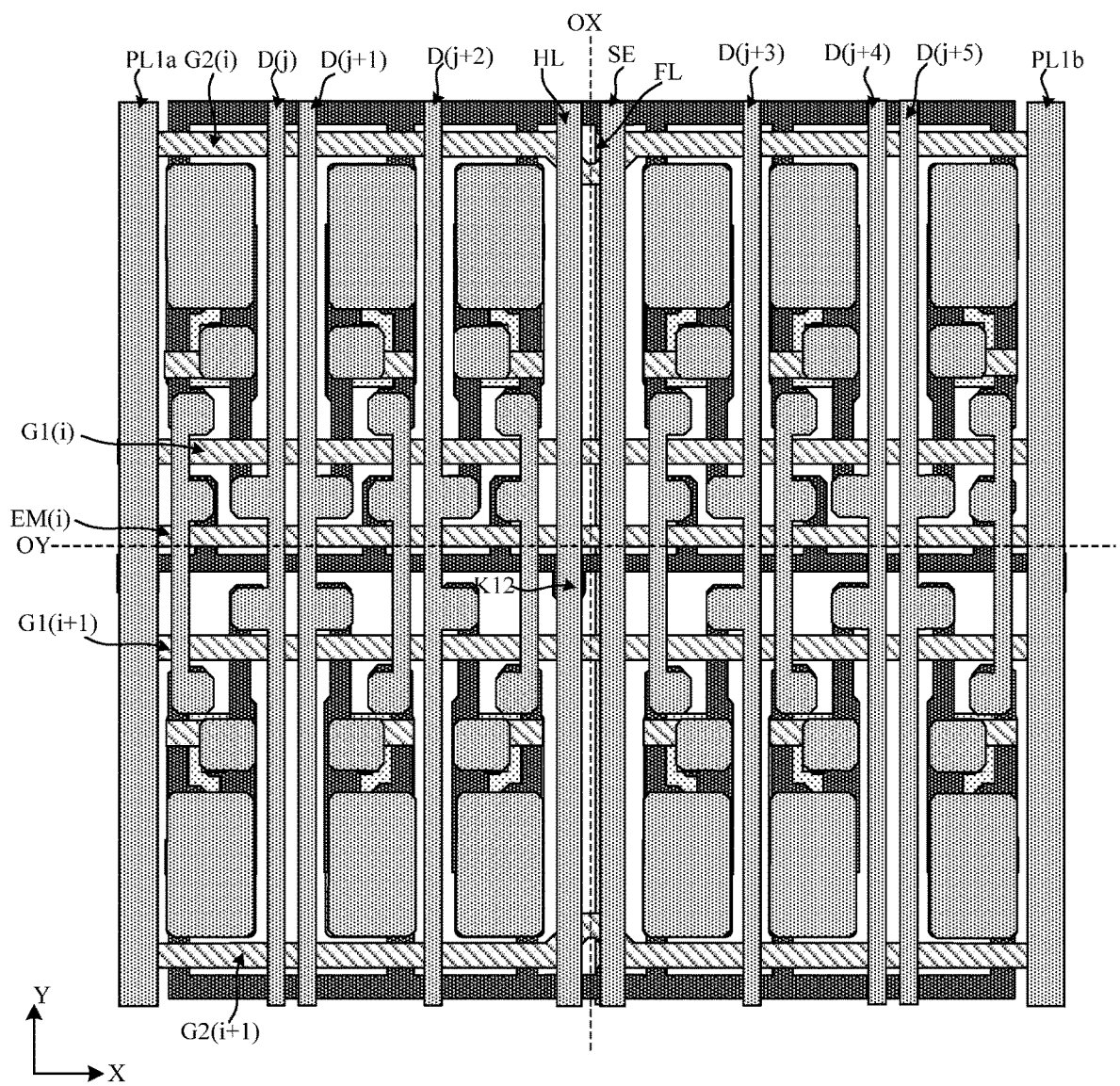
FIG. 16 is another top view of a pixel circuit of a pixel unit group according to at least one embodiment of the present disclosure.

FIG. 16 is another top schematic diagram of a pixel circuit of a pixel unit group according to at least one embodiment of the present disclosure. In some exemplary embodiments, as shown in FIG. 16, one sensing line SE, one first auxiliary power line FL, and one second auxiliary power line HL are disposed between adjacent sub-pixel groups within the pixel unit group. For example, the pixel unit group includes six sub-pixel groups arranged in sequence along the second direction X, wherein one first auxiliary power line FL, one second auxiliary power line HL, and one sensing line SE may be located between the third sub-pixel group and the fourth sub-pixel group of the pixel unit group. The sensing line SE and the second auxiliary power line HL may be located in the third conductive layer, and the first auxiliary power line FL may be located in the first conductive layer. Overlapping between the orthographic projection of the first auxiliary power line FL on the underlay substrate and the orthographic projection of the sensing line SE on the underlay substrate exists. The orthographic projection of the second auxiliary power line HL on the underlay substrate and the orthographic projection of the sensing line SE on the underlay substrate may not overlap. In the second direction X, the second auxiliary power line HL may be located on a side of the sensing line SE, for example, close to a side of the (j+3)-th column sub-pixel group. The second auxiliary power line HL may be electrically connected to the first doped region of the active layer of the light emitting control transistor through the twelfth via hole K12. The second auxiliary power line HL and the first power lines PL1a and PL1b may be electrically connected through the active layer of the light emitting control transistor. In some examples, a width of the second auxiliary power line HL (i.e. the length along the second direction X) may be smaller than the width of the first power line PL1a or PL1b. In the present disclosure, the width represents a feature size in a direction perpendicular to an extending direction.

In the present exemplary embodiment, the IR drop of the first power line may be reduced by disposing the second auxiliary power line between adjacent sub-pixel groups within the pixel unit group.

In some other exemplary embodiments, the pixel unit group includes six sub-pixel groups arranged in sequence along the second direction X, wherein one first auxiliary power line, one second auxiliary power line, and one sensing line may be located between the third sub-pixel group and the fourth sub-pixel group of the pixel unit group. The second auxiliary power line and the first auxiliary power line may be of the same layer structure, for example, both of them are located in the first conductive layer. The sensing line may be located in the third conductive layer. The second auxiliary power line may be electrically connected to the first doped region of the active layer of the light emitting control transistor through a via hole on the first insulating layer. In some examples, the orthographic projection of the sensing line on the underlay substrate may be located between the orthographic projections of the first auxiliary power line and the second auxiliary power line on the underlay substrate. The orthographic projections of the sensing line, the first auxiliary power line, and the second auxiliary power line on the underlay substrate may not overlap. However, the present embodiment is not limited thereto. For example, the sensing line, the first auxiliary power line and the second auxiliary power line may be located between the second sub-pixel group and the third sub-pixel group, or between the fourth sub-pixel group and the fifth sub-pixel group.

For other structures of the display substrate of this embodiment, reference may be made to the description of the aforementioned embodiments, so it will not be repeated here.

Figure 17:
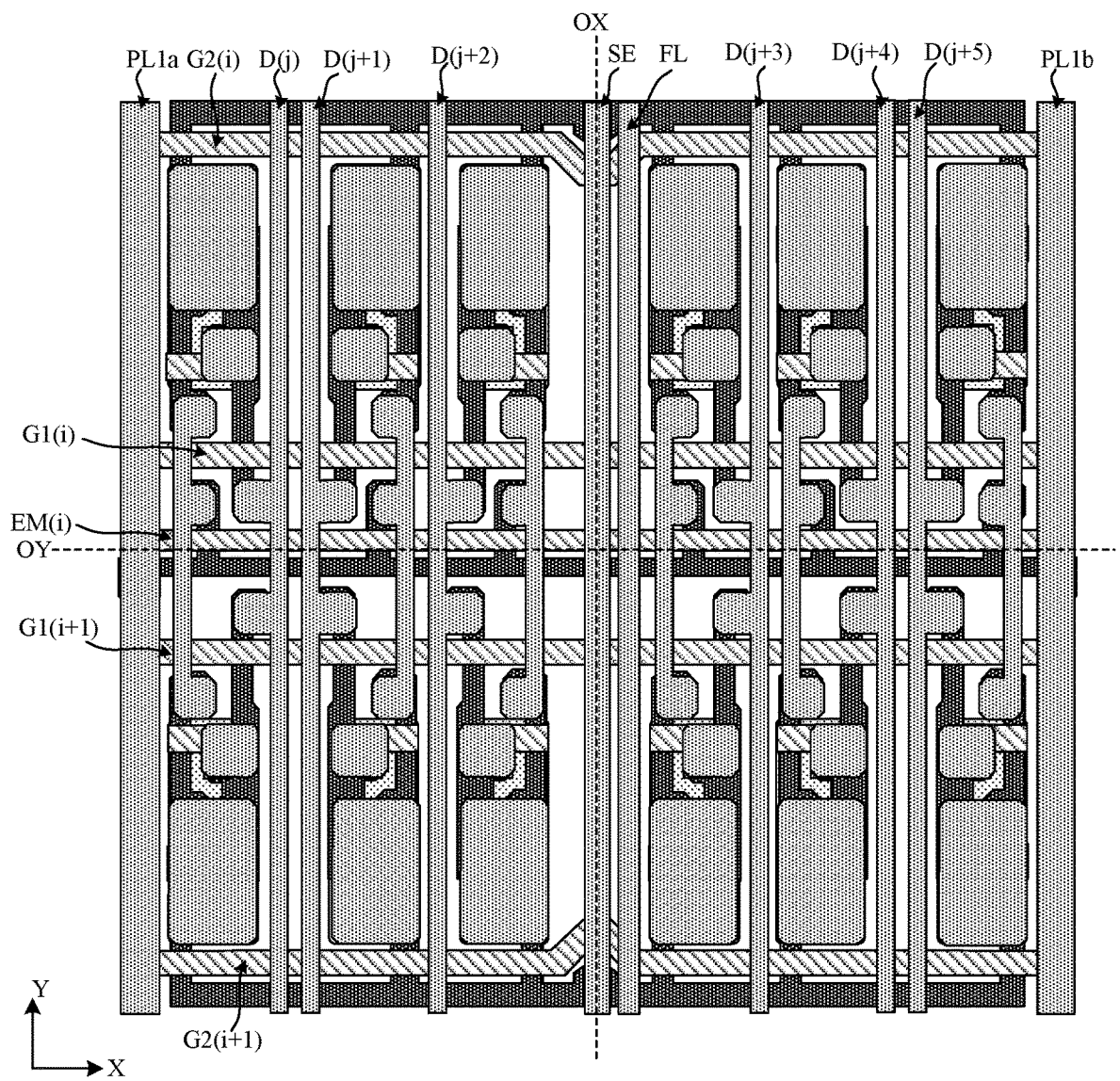
FIG. 17 is another top view of a pixel circuit of a pixel unit group according to at least one embodiment of the present disclosure.

FIG. 17 is another top schematic diagram of a pixel circuit of a pixel unit group according to at least one embodiment of the present disclosure. In some exemplary embodiments, as shown in FIG. 17, one sensing line SE and one first auxiliary power line FL are disposed between adjacent sub-pixel groups within the pixel unit group. For example, the pixel unit group includes six sub-pixel groups arranged in sequence along the second direction X, wherein one first auxiliary power line FL, and one sensing line SE may be located between the third sub-pixel group and the fourth sub-pixel group of the pixel unit group. The sensing line SE and the first auxiliary power line FL are both located in the third conductive layer. The first auxiliary power line FL may be located on a side of the sensing line SE, for example, close to the side of the (j+3)-th column sub-pixel group. However, the present embodiment is not limited thereto. For example, the first auxiliary power line FL may be located on the side of the sensing line SE close to a (j+2)-th column sub-pixel group.

In some other exemplary embodiments, one sensing line and two first auxiliary power lines may be disposed between adjacent sub-pixel groups (e.g., between the third sub-pixel group and the fourth sub-pixel group) within the pixel unit group. The sensing line and the two first auxiliary power lines may both be located in the third conductive layer, and the two first auxiliary power lines may be located respectively on two sides of the sensing line opposite to each other in the second direction X.

In some other exemplary embodiments, one sensing line, one first auxiliary power line, and one second auxiliary power line may be disposed between adjacent sub-pixel groups (e.g., between the third sub-pixel group and the fourth sub-pixel group) within the pixel unit group. The sensing line, the first auxiliary power line, and the second auxiliary power line may all be located in the third conductive layer, and the first auxiliary power line and the second auxiliary power line may be located respectively on opposite two sides of the sensing line in the second direction. The second auxiliary power line may be electrically connected to the first doped region of the active layer of the light emitting control transistor.

For other structures of the display substrate of this embodiment, reference may be made to the description of the aforementioned embodiments, so it will not be repeated here.

The display substrate provided by the present exemplary embodiment may reduce the IR drop of the second power line by disposing a plurality of first auxiliary power lines. Furthermore, by disposing the second auxiliary power line, the IR drop of the first power line may be reduced.

Figure 18:
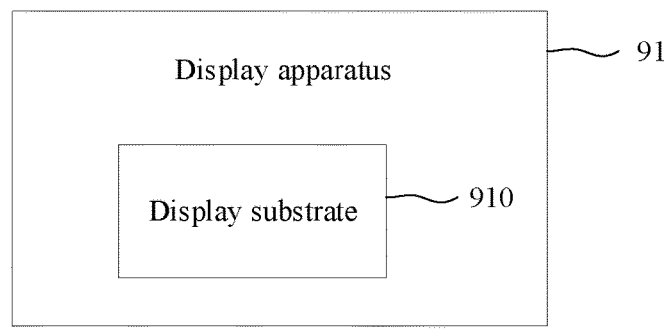
FIG. 18 is a schematic diagram of a display apparatus according to at least one embodiment of the present disclosure.

FIG. 18 is a schematic diagram of a display apparatus according to at least one embodiment of the present disclosure. As shown in FIG. 18, this embodiment provides a display apparatus 91, which includes a display substrate 910 of the aforementioned embodiments. In some examples, the display substrate 910 may be an OLED display substrate, or a QLED display substrate. The display apparatus 91 may be any product or component with a display function, such as a mobile phone, a tablet computer, a television, a display, a notebook computer, a digital photo frame, and a navigator. However, the present embodiment is not limited thereto.

The accompanying drawings in the present disclosure only relate to the structures related to the present disclosure, and other structures may refer to a general design. The embodiments in the present disclosure, i.e., features in the embodiments, may be combined with each other to obtain new embodiments if there is no conflict.

Those of ordinary skill in the art should understand that modification or equivalent replacement may be made to the technical solutions of the present disclosure without departing from the spirit and the scope of the technical solutions of the present disclosure, and should all fall within the scope of the claims of the present disclosure.

The invention claimed is:

1. A display substrate, comprising:
an underlay substrate, comprising a display region;
a plurality of pixel unit groups, located in the display region, wherein:
at least one pixel unit group of the plurality of pixel unit groups comprises a plurality of sub-pixel groups, and at least one sub-pixel group of the plurality of sub-pixel groups comprises a pixel circuit; the pixel circuit comprises a first sub-pixel circuit, a second sub-pixel circuit, and a light emitting control sub-circuit, the first sub-pixel circuit and the second sub-pixel circuit are each electrically connected to the light emitting control sub-circuit, the light emitting control sub-circuit is configured to control a first light emitting element electrically connected to the first sub-pixel circuit to emit light, and to control a second light emitting element electrically connected to the second sub-pixel circuit to emit light;
the first sub-pixel circuit and the second sub-pixel circuit are substantially symmetrical with respect to a center line of the pixel circuit of the sub-pixel group in a first direction;
the at least one sub-pixel group further comprises the first light emitting element electrically connected to the first sub-pixel circuit, the second light emitting element electrically connected to the second sub-pixel circuit; a first electrode of the first light emitting element is electrically connected to the first sub-pixel circuit, a first electrode of the second light emitting element is electrically connected to the second sub-pixel circuit, and second electrodes of the first light emitting element and the second light emitting element are both electrically connected to a second power line;
the underlay substrate further comprises a frame region located on a periphery of the display region; and
the display region is disposed with a plurality of first auxiliary power lines extending along the first direction, wherein at least one first auxiliary power line is electrically connected to the second electrodes of the first light emitting element and the second light emitting element in the frame region.

2. The display substrate of claim 1, wherein the light emitting control sub-circuit of the pixel circuit is located between the first sub-pixel circuit and the second sub-pixel circuit in the first direction.

3. The display substrate of claim 1, wherein the light emitting control sub-circuit is electrically connected to a light emitting control line, wherein the light emitting control line is extended along a second direction and is located between the first sub-pixel circuit and the second sub-pixel circuit; the second direction is intersected with the first direction.

4. The display substrate of claim 1, wherein the light emitting control sub-circuit comprises a light emitting control transistor, wherein a control electrode of the light emitting control transistor is electrically connected to a light emitting control line, a first electrode of the light emitting control transistor is electrically connected to a first power line, and a second electrode of the light emitting control transistor is electrically connected to the first sub-pixel circuit and the second sub-pixel circuit.

5. The display substrate of claim 1, wherein at least one first auxiliary power line is located between adjacent sub-pixel groups within the at least one pixel unit group in the second direction crossing the first direction.

6. The display substrate of claim 1, wherein the display region of the underlay substrate is further disposed with a plurality of first power lines extending along the first direction; at least one first power line is located between adjacent pixel unit groups.

7. The display substrate of claim 6, wherein adjacent pixel unit groups share one of the first power line.

8. The display substrate of claim 1, wherein each sub-pixel group of the at least one pixel unit group comprises the pixel circuit, the at least one pixel unit group is substantially symmetrical with respect to the center line of a plurality of pixel circuits of the pixel unit group in a second direction, and the second direction is intersected with the first direction.

9. The display substrate of claim 1, wherein the display region of the underlay substrate is further disposed with a plurality of sensing lines extending along the first direction; at least one sensing line is located between adjacent sub-pixel groups within the at least one pixel unit group.

10. The display substrate of claim 9, wherein one sensing line and one first auxiliary power line of the plurality of first auxiliary power lines are disposed between adjacent sub-pixel groups within the at least one pixel unit group; an orthographic projection of the sensing line on the underlay substrate is located on a side of an orthographic projection of the first auxiliary power line on the underlay substrate.

11. The display substrate of claim 10, wherein the first auxiliary power line and the sensing line are in a same layer.

12. The display substrate of claim 9, wherein one sensing line and two first auxiliary power lines of the plurality of first auxiliary power lines are disposed between adjacent sub-pixel groups within the at least one pixel unit group;
orthographic projections of the two first auxiliary power lines on the underlay substrate are respectively located on both sides of the orthographic projection of the sensing line on the underlay substrate.

13. The display substrate of claim 10, wherein the first auxiliary power line is located on a side of the sensing line close to the underlay substrate in a direction perpendicular to the display substrate.

14. The display substrate of claim 9, wherein one first auxiliary power line of the plurality of first auxiliary power lines, one sensing line, and one second auxiliary power line are disposed between adjacent sub-pixel groups within the at least one pixel unit group; the second auxiliary power line is extended along the first direction and is electrically connected to a first power line;
there is an overlapping between an orthographic projection of the first auxiliary power line on the underlay substrate and an orthographic projection of the sensing line on the underlay substrate, and an orthographic projection of the second auxiliary power line on the underlay substrate is located on a side of the orthographic projection of the sensing line on the underlay substrate.

15. The display substrate of claim 1, wherein the at least one pixel unit group comprises six sub-pixel groups arranged in sequence along a second direction, wherein pixel circuits of a first sub-pixel group and a second sub-pixel group are substantially symmetrical with respect to a center line of the pixel circuits of the first sub-pixel group and the second sub-pixel group in the second direction, the second direction crossing the first direction.

16. The display substrate of claim 15, wherein the display region of the underlay substrate is further disposed with a plurality of data lines extending along the first direction; two data lines are arranged between the pixel circuits of the first sub-pixel group and the second sub-pixel group, and one data line is arranged between the pixel circuits of the second sub-pixel group and a third sub-pixel group.

17. The display substrate of claim 1, wherein the first sub-pixel circuit comprises a first transistor, a second transistor, a third transistor, and a first storage capacitor;
a control electrode of the first transistor is electrically connected to an i-th first scanning line, a first electrode of the first transistor is electrically connected to a data line, and a second electrode of the first transistor is electrically connected to a control electrode of the third transistor; a control electrode of the second transistor is electrically connected to an i-th second scanning line, a first electrode of the second transistor is electrically connected to a sensing line, and a second electrode of the second transistor is electrically connected to a second electrode of the third transistor; a first electrode of the third transistor is electrically connected to the light emitting control sub-circuit; a first electrode of the first storage capacitor is electrically connected to the control electrode of the third transistor, and a second electrode of the first storage capacitor is electrically connected to the second electrode of the third transistor; the second electrode of the third transistor is electrically connected to a first electrode of the first light emitting element;
the second sub-pixel circuit comprises a fourth transistor, a fifth transistor, a sixth transistor, and a second storage capacitor;
a control electrode of the fourth transistor is electrically connected to an (i+1)-th first scanning line, a first electrode of the fourth transistor is electrically connected to the data line, and a second electrode of the fourth transistor is electrically connected to a control electrode of the sixth transistor; a control electrode of the fifth transistor is electrically connected to an (i+1)-th second scanning line, a first electrode of the fifth transistor is electrically connected to the sensing line, and a second electrode of the fifth transistor is electrically connected to a second electrode of the sixth transistor; a first electrode of the sixth transistor is electrically connected to the light emitting control sub-circuit; a first electrode of the second storage capacitor is electrically connected to a control electrode of the sixth transistor, and a second electrode of the second storage capacitor is electrically connected to the second electrode of the sixth transistor; the second electrode of the sixth transistor is electrically connected to a first electrode of the second light emitting element; herein, i is a natural number.

18. The display substrate of claim 17, wherein in a direction perpendicular to the display substrate, the display substrate comprises a first conductive layer, a semiconductor layer, a second conductive layer, and a third conductive layer which are disposed on the underlay substrate;
the first conductive layer at least comprises the second electrode of the first storage capacitor and the second electrode of the second storage capacitor of the pixel circuit;
the semiconductor layer at least comprises active layers of a plurality of transistors of the pixel circuit, the first electrode of the first storage capacitor, and the second electrode of the second storage capacitor;
the second conductive layer at least comprises control electrodes of the plurality of transistors of the pixel circuit, the first scanning line, the second scanning line, and the light emitting control line;
the third conductive layer at least comprises the data line and the sensing line, wherein the at least one first auxiliary power line electrically connected to the second electrodes of the first light emitting element and the second light emitting element is located at the first conductive layer or the third conductive layer.

19. A display apparatus, comprising the display substrate of claim 1.

* * * * *